US010621938B2

(12) United States Patent
Tanaka et al.

(10) Patent No.: US 10,621,938 B2
(45) Date of Patent: Apr. 14, 2020

(54) DRIVE CIRCUIT OF A GATE DRIVE, DRIVING METHOD THEREOF AND A DISPLAY DEVICE

(71) Applicant: SHARP KABUSHIKI KAISHA, Sakai, Osaka (JP)

(72) Inventors: Kohhei Tanaka, Sakai (JP); Tokihiro Yokono, Sakai (JP); Kaoru Yamamoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/158,050

(22) Filed: Oct. 11, 2018

(65) Prior Publication Data

US 2019/0114984 A1 Apr. 18, 2019

(30) Foreign Application Priority Data

Oct. 12, 2017 (JP) .................................. 2017-198617

(51) Int. Cl.
*G09G 3/36* (2006.01)
*G11C 19/28* (2006.01)

(52) U.S. Cl.
CPC ......... *G09G 3/3677* (2013.01); *G09G 3/3674* (2013.01); *G11C 19/28* (2013.01); *G09G 2310/0286* (2013.01); *G09G 2310/06* (2013.01)

(58) Field of Classification Search
CPC ........................... G09G 3/3677; G09G 3/3674
See application file for complete search history.

(56) References Cited

U.S. PATENT DOCUMENTS

| | | | |
|---|---|---|---|
| 2007/0279360 A1* | 12/2007 | Park ..................... | G09G 3/3614 345/94 |
| 2008/0016139 A1 | 1/2008 | Tsai et al. | |
| 2014/0055332 A1* | 2/2014 | Yamashita .......... | G09G 3/3674 345/100 |
| 2017/0108989 A1* | 4/2017 | Gu ........................ | G06F 3/0412 |

* cited by examiner

*Primary Examiner* — Kevin M Nguyen
(74) *Attorney, Agent, or Firm* — ScienBiziP, P.C.

(57) ABSTRACT

A display device includes a display panel, and drive circuits sequentially scanning gate lines and supplied with any of M-phase (M: three or greater) drive signals having different phases and a first potential or a second potential (lower) at predetermined cycles. The drive circuit includes netA(n) whose potential changes by drive signal with the first/second potential as reference, and an output circuit switching a corresponding gate line to a selected/unselected state and including first output switch including a gate connected to netA(n+1) of a first drive circuit different from the drive circuit, a drain supplied with the drive signal, and a source connected to the gate line. Difference between the potential of netA(n+1) in case of switching the gate line to the unselected/selected state and the reference potential in netA (n+1) is equal to difference between the first and second potentials or greater.

13 Claims, 33 Drawing Sheets

400

DRIVE CIRCUIT OF A GATE DRIVE, DRIVING METHOD THEREOF AND A DISPLAY DEVICE

BACKGROUND

1. Field

The present disclosure relates to a display device.

2. Description of the Related Art

Various configurations related to a shift register for scanning a gate line in a display panel are suggested in the related art. U.S. Patent Application Publication No. 2008/0016139 discloses a technology for suppressing an incapability to control the gate line to have an appropriate electric potential due to degradation of a transistor that switches the target gate line to be in an unselected state.

In U.S. Patent Application Publication No. 2008/0016139, two transistors (T6, T7) that switch the gate line to be in the unselected state are disposed in one shift register S(n). One transistor (T7) outputs a voltage signal VSS to the target gate line when the electric potential (Vc2(n)) of an internal node in the shift register S(n) is at a high (H) level. The other transistor (T6) outputs the voltage signal VSS to the target gate line when the electric potential (Vc1(n+2)) of an internal node of the shift register S(n+2) in the subsequent stage is at the H level.

While the internal node Vc2(n) is at the H level even after the voltage signal VSS is applied to the target gate line, the electric potential of the internal node Vc1(n+2) is at the H level only when the shift register S(n+2) switches the gate line to be in a selected state. Thus, the transistor (T6) is less degraded than the transistor (T7), and the transistor (T6) can output the voltage signal VSS to the gate line even in a case where the transistor (T7) is degraded.

It is preferable that a transition of a gate line from a selected state to an unselected state or a transition of the gate line from the unselected state to the selected state is promptly made. For example, in a case where there is a delay in transition to the unselected state, a data signal that is to be written when the gate line is in the selected state coexists with a data signal to be written when the subsequent gate line is in the selected state, and display quality is decreased.

It is desirable to provide a technology for making a prompt transition of a gate line to a selected state or an unselected state.

SUMMARY

According to an aspect of the present disclosure, there is provided a display device including a display panel that includes a plurality of gate lines, and a drive unit that includes a plurality of drive circuits which are respectively disposed in correspondence with the plurality of gate lines and sequentially scan the plurality of gate lines using a supplied control signal, in which the control signal includes M-phase (M is a natural number greater than or equal to three) drive signals that have different phases and are set to have a first electric potential or a second electric potential lower than the first electric potential at a predetermined cycle, each of the plurality of drive circuits includes internal wiring of which an electric potential changes depending on one drive signal, and an output circuit unit that switches a corresponding gate line to be in a selected state or an unselected state, and in one drive circuit, the electric potential of the internal wiring changes with the first electric potential or the second electric potential as a reference, the output circuit unit includes at least one first output switching element, the first output switching element includes a gate electrode that is connected to the internal wiring of a first drive circuit different from the drive circuit among the plurality of drive circuits, a drain electrode that is supplied with the one drive signal, and a source electrode that is connected to the corresponding gate line, and a difference in an electric potential between the electric potential of the internal wiring of the first drive circuit in a case where the corresponding gate line transitions to the unselected state or the selected state and the electric potential as the reference in the internal wiring is greater than or equal to a difference in an electric potential between the first electric potential and the second electric potential.

DESCRIPTION OF THE EMBODIMENTS

Figure 1:
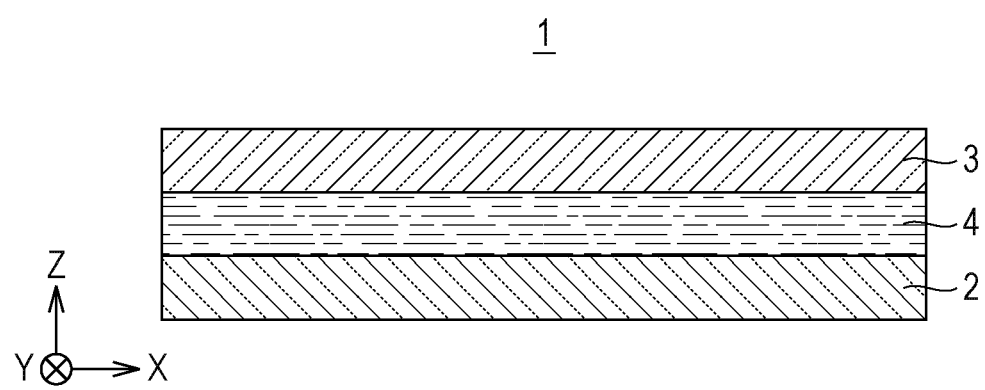
FIG. 1 is a schematic sectional view of a display device in a first embodiment.

A display device in one embodiment of the present disclosure includes a display panel that includes a plurality of gate lines, and a drive unit that includes a plurality of drive circuits which are respectively disposed in correspondence with the plurality of gate lines and sequentially scan the plurality of gate lines using a supplied control signal. The control signal includes M-phase (M is a natural number greater than or equal to three) drive signals that have different phases and are set to have a first electric potential or a second electric potential lower than the first electric potential at a predetermined cycle. Each of the plurality of drive circuits includes internal wiring of which an electric potential changes depending on one drive signal, and an output circuit unit that switches a corresponding gate line to be in a selected state or an unselected state. In one drive circuit, the electric potential of the internal wiring changes with the first electric potential or the second electric potential as a reference, the output circuit unit includes at least one first output switching element. The first output switching element includes a gate electrode that is connected to the internal wiring of a first drive circuit different from the drive circuit among the plurality of drive circuits, a drain electrode that is supplied with the one drive signal, and a source electrode that is connected to the corresponding gate line. A difference in an electric potential between the electric potential of the internal wiring of the first drive circuit in a case where the corresponding gate line transitions to the unselected state or the selected state and the electric potential as the reference in the internal wiring is greater than or equal to a difference in an electric potential between the first electric potential and the second electric potential (first configuration).

According to the first configuration, the drive circuit includes the internal wiring and the output circuit unit that switches the gate line to be in the selected state or the unselected state. The electric potential of the internal wiring changes depending on one drive signal of the M-phase drive signals with the first electric potential or the second electric potential as the reference. The first switching element of the output circuit unit is configured by connecting its source electrode to the gate line, supplying its drain electrode with the one drive signal, and connecting its gate electrode to the internal wiring of another first drive circuit. When the gate line is set to be in the selected state or the unselected state, the difference between the electric potential of the internal wiring of the first drive circuit and the electric potential as the reference in the internal wiring is greater than or equal to the difference in an electric potential between the first electric potential and the second electric potential. Thus, in a case where the gate line is switched to be in the selected state or the unselected state, a higher voltage can be applied to the gate electrode of the first switching element of the output circuit unit, and the gate line can be caused to promptly transition to the selected state or the unselected state.

In the first configuration, the internal wiring of the first drive circuit may be charged depending on a drive signal of which a phase difference with the one drive signal is greater than or equal to a minimum phase difference of the M-phase drive signals and less than a period of the first electric potential or the second electric potential in the predetermined cycle (second configuration).

In the second configuration, the internal wiring of the first drive circuit may be charged depending on a drive signal of which a phase is set to be later by the minimum phase difference than the one drive signal. When the corresponding gate line is switched to be in the unselected state, the internal wiring of the first drive circuit may have an electric potential higher than or equal to the first electric potential (third configuration).

According to the third configuration, in a case where the gate line is switched to be in the unselected state, the gate electrode of the first switching element of the drive circuit corresponding to the gate line is supplied with the electric potential higher than or equal to the first electric potential. Thus, the gate line can be caused to promptly transition to the unselected state.

In the second configuration, the internal wiring of the first drive circuit may be charged depending on a drive signal of which a phase is set to be earlier by the minimum phase difference than the one drive signal, and when the corresponding gate line is switched to be in the selected state, the internal wiring of the first drive circuit may have an electric potential higher than or equal to the first electric potential (fourth configuration).

According to the fourth configuration, in a case where the gate line is switched to be in the selected state, the gate electrode of the first switching element of the drive circuit corresponding to the gate line is supplied with the electric potential higher than or equal to the first electric potential. Thus, the gate line can be caused to promptly transition to the selected state.

In the third or fourth configuration, the output circuit unit may further include a second output switching element. The second output switching element may include a gate electrode that is connected to the internal wiring of a second drive circuit different from the first drive circuit among the plurality of drive circuits, a drain electrode that is supplied with the one drive signal, and a source electrode that is connected to the corresponding gate line. The internal wiring of the second drive circuit may be charged depending on a drive signal of which a phase is different from a drive signal supplied to the first drive circuit. When the corresponding gate line is switched to be in the selected state, and when the corresponding gate line is switched to be in the unselected state, the internal wiring of the first drive circuit or the second drive circuit may have an electric potential higher than or equal to the first electric potential (fifth configuration).

According to the fifth configuration, in a case where the gate line transitions to the selected state, and in a case where the gate line transitions to the unselected state, the gate electrode of the first switching element or the second switching element of the drive circuit corresponding to the gate line is supplied with the electric potential higher than or equal to the first electric potential. Thus, the gate line can be promptly switched to be in the selected state and the unselected state, and display quality can be improved.

In any of the first to fourth configurations, the output circuit unit in the one drive circuit may further include a third output switching element that decreases an electric potential of the corresponding gate line to the second electric potential when the corresponding gate line is set to be in the unselected state (sixth configuration).

According to the sixth configuration, the gate line can be caused to securely transition to the unselected state.

In any of the first to fifth configurations, the output circuit unit in the one drive circuit may further include a fourth output switching element. The fourth output switching element may include a gate electrode that is connected to the internal wiring of the one drive circuit, a drain electrode that is supplied with the one drive signal, and a source electrode that is connected to the corresponding gate line (seventh configuration).

According to the seventh configuration, the output of the output circuit unit can be increased, compared to that in a case where the fourth output switching element is not disposed.

In any of the first to sixth configurations, the drive circuits corresponding to the gate lines may be individually arranged in each area at both ends of the gate lines outside a display area in the display panel (eighth configuration).

According to the eighth configuration, since one gate line is driven by two drive circuits, the gate line can be securely switched to be in the selected state or the unselected state.

In any of the first to sixth configurations, the plurality of drive circuits may be distributedly arranged in a first area on one end part side of the gate lines and a second area on the other end part side outside a display area in the display panel (ninth configuration).

According to the ninth configuration, the area in which the drive circuit is disposed can be narrowed, compared to that in a case where the drive circuits for one gate line are arranged in the first area and the second area respectively.

In the ninth configuration, the drive circuits that correspond to the odd-numbered gate lines among the plurality of gate lines may be arranged in the first area. The drive circuits that correspond to the even-numbered gate lines among the plurality of gate lines may be arranged in the second area (tenth configuration).

According to the tenth configuration, the number of drive circuits arranged in the first area and the second area is reduced to half, compared to that in a case where the drive circuits for one gate line are arranged in the first area and the second area respectively. Thus, the area in which the drive circuits are disposed in the first area and the second area can be narrowed.

In any of the fourth to seventh configurations, the plurality of drive circuits may be distributedly arranged in a first area on one end part side of the gate lines and a second area on the other end part side outside a display area in the display panel. The internal wiring of the drive circuits corresponding to the odd-numbered gate lines among the plurality of gate lines and a part of the switching elements of the output circuit unit may be arranged in the first area, and the other switching elements of the output circuit unit may be arranged in the second area. The internal wiring of the drive circuits corresponding to the even-numbered gate lines among the plurality of gate lines and a part of the switching elements of the output circuit unit may be arranged in the second area, and the other switching elements of the output circuit unit may be arranged in the first area (eleventh configuration).

According to the eleventh configuration, the number of drive circuits arranged in the first area and the second area can be reduced, compared to that in a case where the drive circuits for one gate line are arranged in the first area and second area respectively. Thus, the area in which the drive circuits are disposed in the first area and the second area can be narrowed.

In any of the first to eleventh configurations, the drive unit may alternately switch between a scanning period for scanning the gate lines and a non-scanning period for stopping the scanning of the gate lines in one vertical scanning period. A specific gate line that is in the selected state may be present in plural number among the plurality of gate lines before the non-scanning period is started. A drive circuit that corresponds to the one specific gate line may switch the one specific gate line to be in the unselected state until the non-scanning period is started. A first drive signal that is supplied to the first drive circuit connected to the first output switching element in the drive circuit corresponding to the one specific gate line among the M-phase drive signals may be continuously supplied until the one specific gate line is switched to be in the unselected state (twelfth configuration).

According to the twelfth configuration, in a case where, a data voltage is applied to pixels in which a specific gate line in the selected state before the start of the non-scanning period is disposed, the specific gate line can be switched to be in the unselected state before the start of the non-scanning period. Thus, a situation where the specific gate line is not set to be in the selected state during the non-scanning period, and pixels that are not intended are driven at the time of resuming the scanning period can be reduced.

In the twelfth configuration, the M-phase drive signals may be individually supplied such that an electric potential of the first drive signal is set to the first electric potential when the scanning period is resumed after the non-scanning period. The first drive circuit may switch the other specific gate lines other than the one specific gate line to be in the selected state based on the first drive signal after the scanning period is resumed (thirteenth configuration).

According to the thirteenth configuration, a specific gate line that is in the selected state before the start of the non-scanning period can be switched to be in the selected state again in a case where the scanning period is resumed. Thus, when the scanning period is resumed, data can be securely written into the pixels in which the specific gate line is disposed.

Hereinafter, embodiments of the present disclosure will be described in detail with reference to the drawings. The same or corresponding parts in the drawings will be designated by the same reference signs, and descriptions of such parts will not be repeated. In order to facilitate understanding of description, configurations are illustrated in a simplified or schematic manner, or a part of constituent members are not illustrated in the drawings referred to below. In addition, the ratio of dimensions among the constituent members illustrated in each drawing may not show the actual ratio of dimensions.

First Embodiment

FIG. 1 is a schematic sectional view of a display device in the present embodiment. A display device 1 in the present embodiment includes an active matrix substrate 2, a counter substrate 3, and a liquid crystal layer 4 that is sandwiched between the active matrix substrate 2 and the counter substrate 3. Each of the active matrix substrate 2 and the counter substrate 3 includes an almost transparent (having high transparency) glass substrate. In addition, while illustration is not provided, the display device 1 in FIG. 1 includes a backlight and a pair of polarizers. The backlight is disposed in an in-plane direction of the active matrix substrate 2 on the opposite side from the liquid crystal layer 4. The active matrix substrate 2 and the counter substrate 3 are interposed between the pair of polarizers. While illustration is not provided, the counter substrate 3 includes color filters of three colors of red (R), green (G), and blue (B).

In the present embodiment, in the display device 1, a drive mode for liquid crystal molecules included in the liquid crystal layer 4 is a transverse electric field drive mode. In order to implement the transverse electric field drive mode, a pixel electrode and a counter electrode (common electrode) for forming an electric field are formed in the active matrix substrate 2. Hereinafter, a configuration of the active matrix substrate 2 will be specifically described.

Figure 2A:
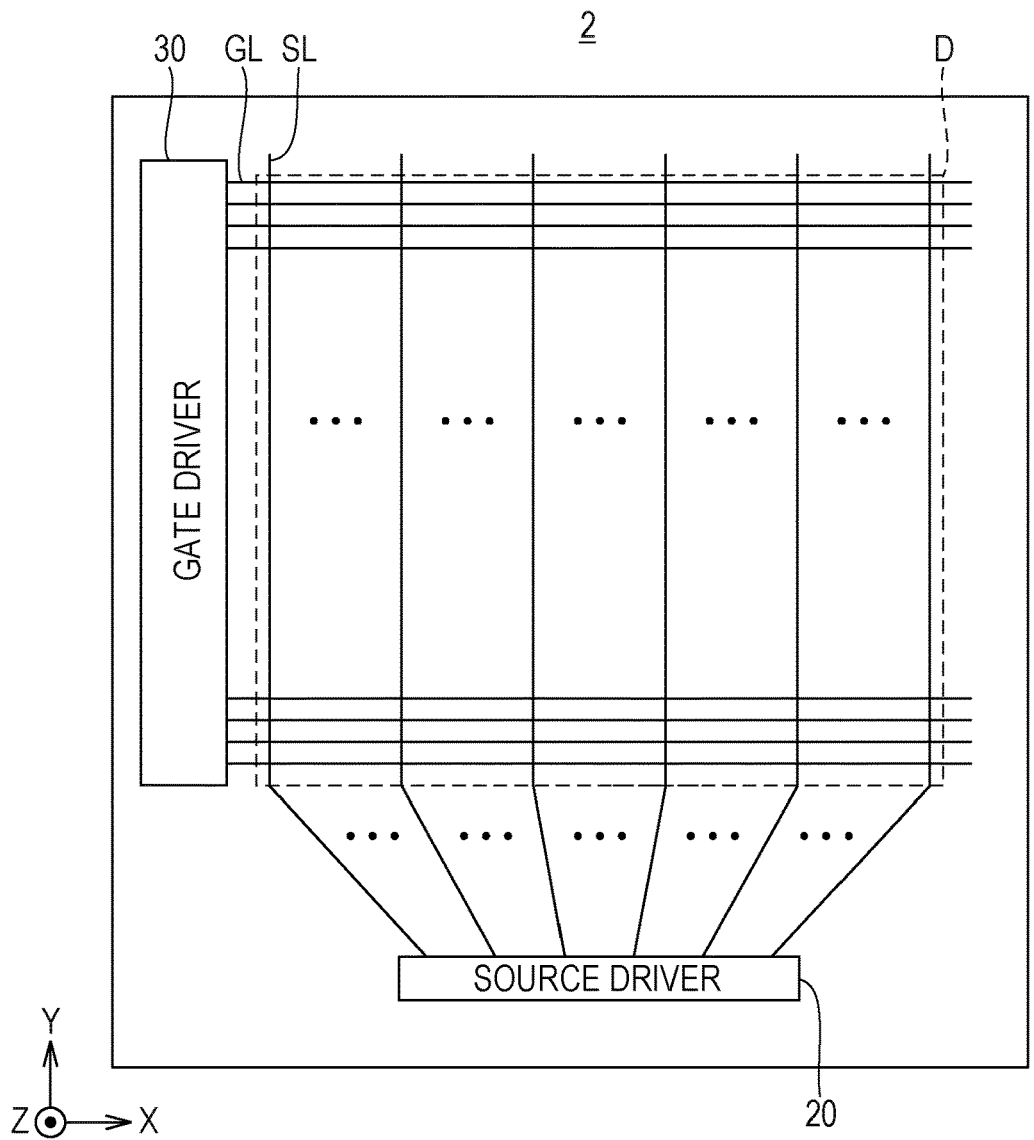
FIG. 2A is a plan view illustrating a schematic configuration of an active matrix substrate illustrated in FIG. 1.

FIG. 2A is a plan view illustrating a schematic configuration of the active matrix substrate 2. The active matrix substrate 2 illustrated in FIG. 2A includes a plurality of gate lines GL, a plurality of source lines SL, a source driver 20, and a gate driver 30.

While illustration is not provided in FIG. 2A, in the active matrix substrate 2, pixels are formed by disposing pixel electrodes in areas defined by the gate lines GL and the source lines SL. The active matrix substrate 2 has a display area D that is configured with each pixel. Each pixel corresponds to any color of R, G, or B of the color filters (not illustrated) disposed in the counter substrate 3.

Figure 2B:
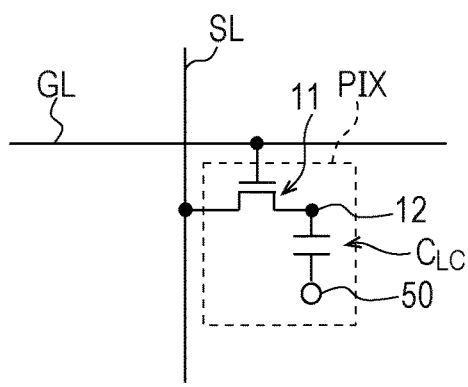
FIG. 2B is an equivalent circuit view of one pixel.

FIG. 2B is a view illustrating an equivalent circuit of one pixel. A pixel PIX includes a thin film transistor (TFT) 11, a pixel electrode 12, and a counter electrode 50. The TFT 11 is configured by connecting its gate electrode to the gate line GL, connecting its source electrode to the source line SL, and connecting its drain electrode to the pixel electrode 12. A liquid crystal capacity $C_s$ is formed between the pixel electrode 12 and the counter electrode 50.

As illustrated in FIG. 2A, the source driver 20 and the gate driver 30 are disposed outside the display area D. While illustration is not provided in FIG. 2A, the gate driver 30 includes drive circuits that are disposed in correspondence with the gate lines GL respectively.

Each drive circuit is disposed in the vicinity of one end part of the gate line GL. Each drive circuit applies a predetermined voltage (hereinafter, selection voltage) to the gate line GL and switches the gate line GL to be in a selected state. Hereinafter, setting the gate line GL to be in the selected state may be called scanning or driving of the gate line GL.

The source driver 20 is disposed in a picture-frame area on one end part side of the source lines SL outside the display area D and is connected to each source line SL. The source driver 20 supplies a data signal for displaying an image to each source line SL.

Figure 3:
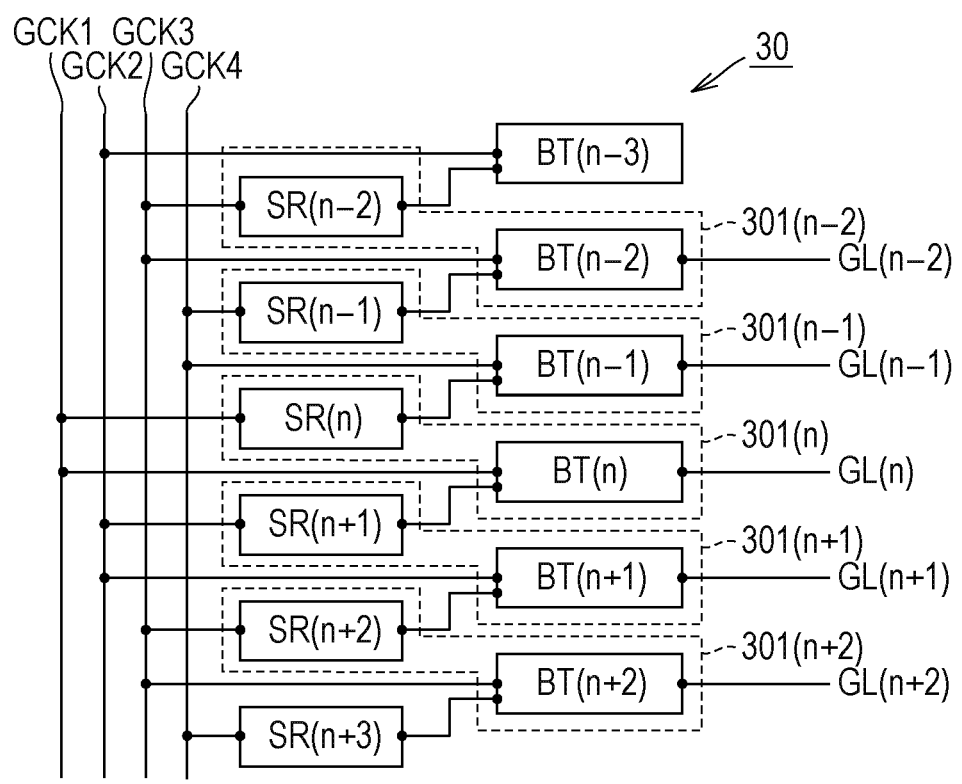
FIG. 3 is a schematic view illustrating a schematic configuration of each drive circuit of a gate driver illustrated in FIG. 2A.

FIG. 3 is a schematic view illustrating a schematic configuration of each drive circuit of the gate driver 30 in the present embodiment. In FIG. 3, for convenience, only drive circuits 301(n−2) to 301(n+2) that drive the gate lines GL(n−2) to GL(n+2) respectively are illustrated. Hereinafter, each drive circuit will be referred to as a drive circuit 301 when not distinguished from each other.

As illustrated in FIG. 3, each drive circuit 301 includes a shift register unit SR and an output buffer unit BT. Drive signals (hereinafter, clock signals) denoted by GCK1 to GCK4, and a reset signal CLR and power supply voltages (VDD, VSS), not illustrated, are input into the drive circuits 301 by a controller 40. Each drive circuit 301 is connected to terminals into which the drive signal, a control signal, and the power supply voltages are input. Each drive circuit 301 drives its corresponding gate line GL based on the drive signal, the control signal, and the power supply voltages supplied.

Each of the clock signals GCK1 to GCK4 periodically has a high (H) level electric potential and a low (L) level electric potential repeatedly at a predetermined cycle. The clock signals GCK1 to GCK4 are 4-phase clock signals having different phases.

In this example, the H level electric potential is the same as the electric potential of the power supply voltage VDD, and the L level electric potential is, for example, the same as the electric potential of the power supply voltage VSS.

Clock signals in each combination of the clock signals GCK1 and GCK3, and the clock signals GCK2 and GCK4 are in opposite phases. In addition, the phases of the clock signals GCK1, GCK2, and GCK4 are shifted by one horizontal scanning period from each other, and the phases of the clock signals GCK3, GCK2, and GCK4 are shifted by one horizontal scanning period from each other.

That is, in this example, each of the clock signals GCK1 to GCK4 alternately has the H level and L level electric potentials for every two horizontal scanning periods repeatedly. That is, one cycle of the H level and L level electric potentials in each of the clock signals GCK1 to GCK4 corresponds to four horizontal scanning periods (4H). The minimum phase difference among the clock signals GCK1 to GCK4 is one horizontal scanning period.

The reset signal CLR is a signal that is set to have the H level electric potential for two horizontal scanning periods in every one vertical scanning period and is set to have the L level electric potential in other periods.

Each drive circuit 301 is supplied with any clock signal of the clock signals GCK1 to GCK4. Specifically, the drive circuit 301(n) is supplied with a clock signal of which the phase is later by one horizontal scanning period than that of the drive circuit 301(n−1) in the previous stage and is earlier by one horizontal scanning period than that of the drive circuit 301(n+1) in the subsequent stage.

The shift register unit SR of each drive circuit 301 is a circuit unit that controls the electric potential of the internal wiring of the drive circuit 301 depending on the supplied clock signal. The output buffer unit BT operates depending on the output of the shift register unit SR of the drive circuit 301 in the subsequent stage, that is, the electric potential of the internal wiring of the drive circuit 301 in the subsequent stage.

Figure 4:
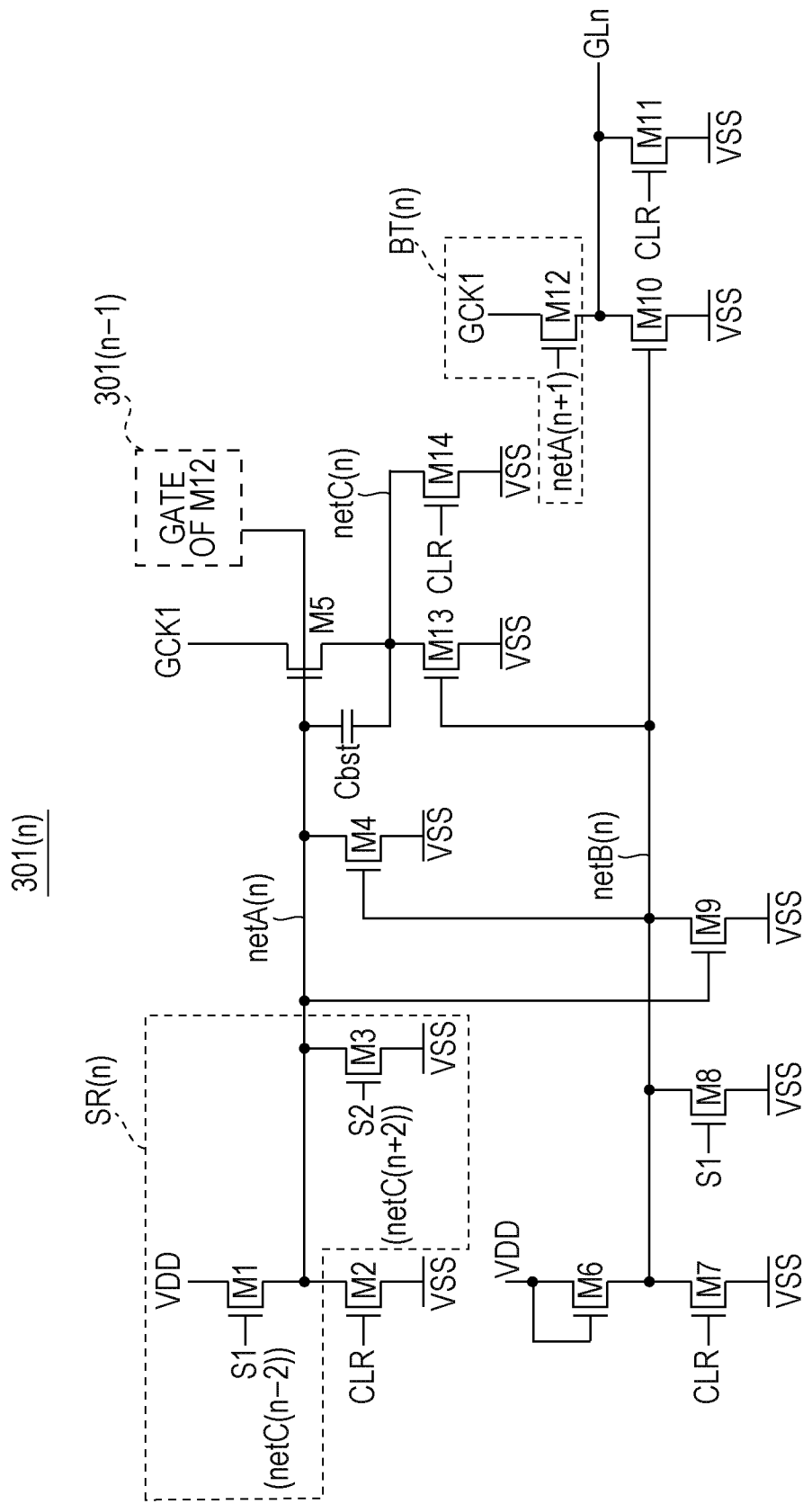
FIG. 4 is an equivalent circuit view of the drive circuit illustrated in FIG. 3.

A specific configuration example of each drive circuit of the gate driver 30 will be described. FIG. 4 is an equivalent circuit view of the drive circuit 301(*n*). Here, n is a natural number greater than or equal to three.

The drive circuit 301(*n*) illustrated in FIG. 4 is configured by connecting TFTs denoted by M1 to M14 to a capacitor Cbst. Hereinafter, the TFTs denoted by M1 to M14 will be referred to as TFT_M1 to TFT_M14. In this example, each of TFT_M1 to TFT_M14 is configured with an n-channel TFT.

The drive circuit 301(*n*) includes internal wiring denoted by netA(n), netB(n), and netC(n).

The internal wiring netA(n) connects TFT_M1 to TFT_M5, TFT_M9, and the capacitor Cbst to TFT_M12 of the drive circuit 301(*n*–1).

The internal wiring netB(n) connects TFT_M4, TFT_M6 to TFT_M10, and TFT_M13.

The internal wiring netC(n) connects TFT_M5, TFT_M13, TFT_M14, and the capacitor Cbst.

In this example, TFT_M1, TFT_M2, and netA(n) function as the shift register SR(n), and TFT_M12 functions as the output buffer unit BT(n).

TFT_M1 is configured by connecting its gate electrode to an S1 terminal, connecting its drain electrode to a VDD terminal, and connecting its source electrode to netA(n). The internal wiring netC(n–2) in the drive circuit 301(*n*–2) is connected to the S1 terminal. The power supply voltage VDD is supplied to the VDD terminal.

TFT_M2 is configured by connecting its gate electrode to a CLR terminal, connecting its drain electrode to netA(n), and connecting its source electrode to a VSS terminal. The reset signal CLR is supplied to the CLR terminal. The power supply voltage VSS is supplied to the VSS terminal.

TFT_M3 is configured by connecting its gate electrode to an S2 terminal, connecting its drain electrode to netA(n), and connecting its source electrode to the VSS terminal. The internal wiring netC(n+2) in the drive circuit 301(*n*+2) is connected to the S2 terminal connected to the drive circuit 301(*n*).

TFT_M4 is configured by connecting its gate electrode to netB(n), connecting its drain electrode to netA(n), and connecting its source electrode to the VSS terminal.

TFT_M5 is configured by connecting its gate electrode to netA(n), connecting its drain electrode to a GCK1 terminal, and connecting its source electrode to netC(n). The clock signal GCK1 is supplied to the GCK1 terminal.

TFT_M6 is configured by connecting its gate electrode and its drain electrode to the VDD terminal and connecting its source electrode to netB(n).

TFT_M7 is configured by connecting its gate electrode to the CLR terminal, connecting its drain electrode to netB(n), and connecting its source electrode to the VSS terminal.

TFT_M8 is configured by connecting its gate electrode to the S1 terminal, connecting its drain electrode to netB(n), and connecting its source electrode to the VSS terminal.

TFT_M9 is configured by connecting its gate electrode to netA(n), connecting its drain electrode to netB(n), and connecting its source electrode to the VSS terminal.

TFT_M10 is configured by connecting its gate electrode to netB(n), connecting its drain electrode to the gate line GL(n), and connecting its source electrode to the VSS terminal.

TFT_M11 is configured by connecting its gate electrode to the CLR terminal, connecting its drain electrode to the gate line GL(n), and connecting its source electrode to the VSS terminal.

TFT_M12 is configured by connecting its gate electrode to netA(n+1) of the drive circuit 301(*n*+1) driving the gate line GL(n+1), connecting its drain electrode to the GCK1 terminal, and connecting its source electrode to the gate line GL(n). TFT_M12 functions as the output buffer unit BT(n).

TFT_M13 is configured by connecting its gate electrode to netB(n), connecting its drain electrode to netC(n), and connecting its source electrode to the VSS terminal.

TFT_M14 is configured by connecting its gate electrode to the CLR terminal, connecting its drain electrode to netC(n), and connecting its source electrode to the VSS terminal.

The capacitor Cbst is configured by connecting one of its electrodes to netA(n) and connecting the other electrode to netC(n).

In FIG. 4, while an example of the drive circuit 301(*n*) is described, the other drive circuits 301 have the same configuration. However, depending on the gate line GL driven by each drive circuit 301, the clock signal supplied to the drive circuit 301, and netC connected to the S1 terminal and the S2 terminal connected to the drive circuit 301 are different.

Figure 5A:
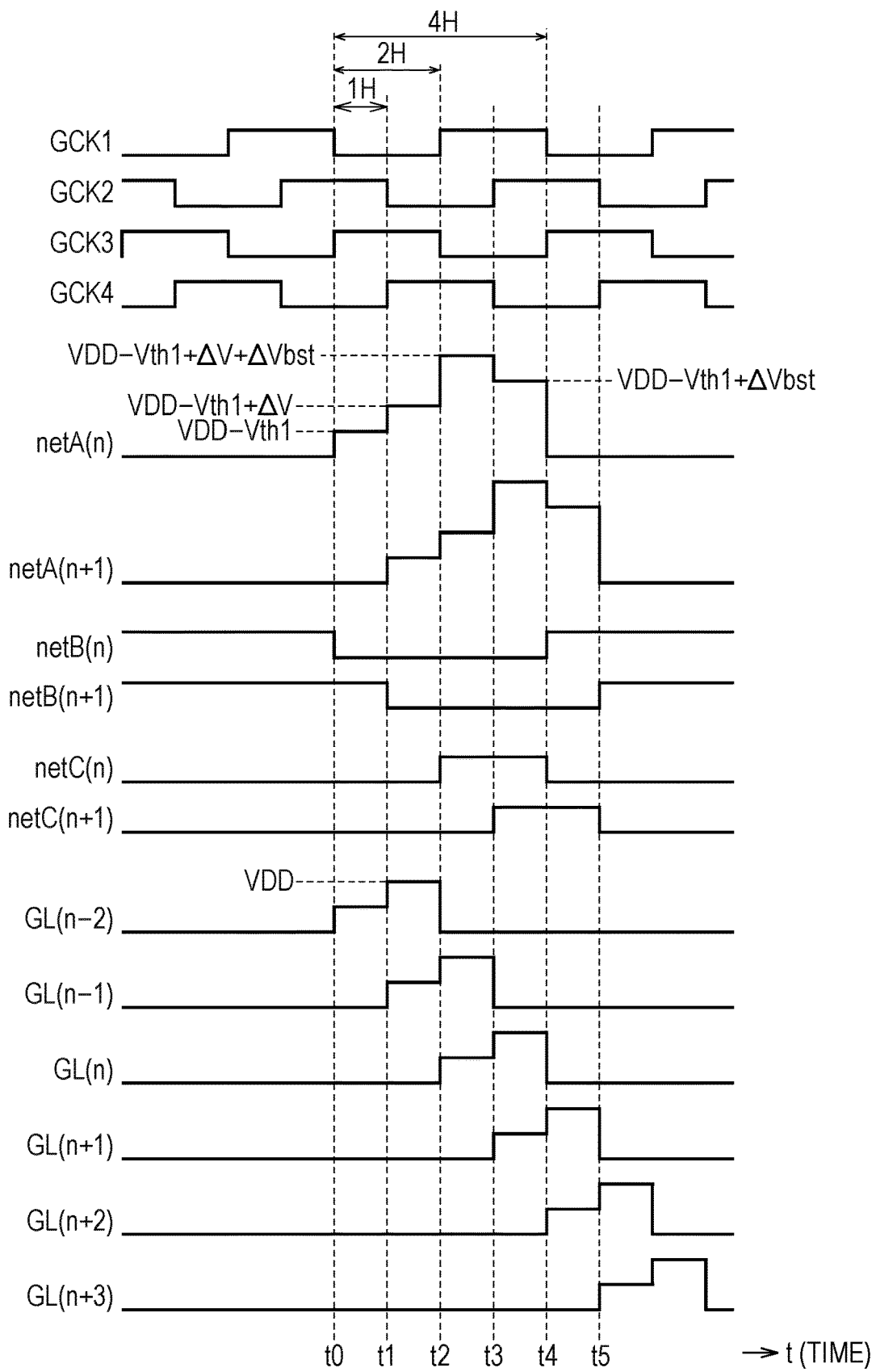
FIG. 5A is a timing chart in a case where the drive circuit in the first embodiment drives a gate line.

The operation of each drive circuit 301 will be described. FIG. 5A is a timing chart in a case where the drive circuit 301(*n*) drives the gate line GL(n). While the reset signal CLR is not illustrated in FIGS. 5A to 5D, the reset signal CLR, for example, is set to have the H level electric potential for only one horizontal scanning period in every one vertical scanning period and maintains the L level electric potential in other periods.

At time t0, the clock signal GCK3 is set to have the H level electric potential, and netC(n–2) (not illustrated) of the drive circuit 301(*n*–2) transitions to the H level electric potential. At this point, TFT_M1 of the drive circuit 301(*n*) is set to be in an ON state. At this point, since netB(n) and netC(n+2) (not illustrated) of the drive circuit 301(*n*+2) have the L level electric potential, TFT_M2 to TFT_M4 are in an OFF state. Accordingly, netA(n) is precharged to an electric potential of "VDD–Vth1" (Vth1=threshold voltage of TFT_M1) through TFT_M1.

In addition, at this point, TFT_M8 is in the ON state, and TFT_M9 is set to be in the ON state by the precharging of netA(n). Accordingly, netB(n) is discharged to the L level electric potential. Since the electric potential of netB(n) is at the L level, TFT_M10 is set to be in the OFF state.

In addition, at time t0, since the electric potential of netA(n+1) of the drive circuit 301(*n*+1) is at the L level, TFT_M12 is in the OFF state. Accordingly, the gate line GL(n) maintains the L level electric potential.

While TFT_M5 is also set to be in the ON state by the precharging of netA(n), the clock signal GCK1 has the L level electric potential. Thus, netC(n) maintains the L level electric potential.

Next, at time t1, the clock signal GCK4 transitions to the H level electric potential, and netA(n) is continuously precharged. Since netA(n) is connected to the gate electrode of TFT_M12 of the drive circuit 301(*n*–1), parasitic capacitance is present between TFT_M12 of the drive circuit 301(*n*–1) and netA(n). Thus, in a case where the clock signal GCK4 supplied to TFT_M12 of the drive circuit 301(*n*–1) transitions to the H level electric potential from the L level, the parasitic capacitance increases the electric potential of netA(n) by ΔV. Consequently, netA(n) is precharged to an electric potential of "VDD−Vth1+ΔV".

In addition, at this point, precharging of netA(n+1) is started, and TFT_M12 of the drive circuit 301(n) is set to be in the ON state. The electric potential of the clock signal GCK1 is at the L level, and TFT_M8 to TFT_M10 are in the ON state. Thus, the gate line GL(n) and netC(n) maintain the L level electric potential.

Next, at time t2, the clock signal GCK1 transitions to the H level electric potential. As the electric potential of the clock signal GCK1 is increased, the electric potential of netC(n) is increased to the H level from the L level through TFT_M5. At this point, the electric potential of netA(n) is boosted through the capacitor Cbst, and the electric potential of netA(n) is increased to an electric potential of "VDD−Vth1+ΔV+ΔVbst" that is higher than the threshold voltage of TFT_M5. Here, ΔVbst denotes a voltage that is boosted by the capacitor Cbst. Accordingly, a voltage higher than or equal to the threshold voltage of TFT_M5 is applied to TFT_M5. The drain and the source of TFT_M5 are conducted to each other, and netC(n) is charged to the H level (VDD) electric potential.

In addition, at this point, the electric potential of netA(n+1) in the drive circuit 301(n+1) is "VDD−Vth1+ΔV", and TFT_M12 of the drive circuit 301(n) is in the ON state. Thus, the gate line GL(n) is charged to an electric potential of "VDD−Vth1+ΔV−Vth12" through TFT_M12. Here, Vth12 denotes the threshold voltage of TFT_M12 of the drive circuit 301(n+1).

Next, at time t3, the clock signal GCK4 transitions to the L level electric potential. The clock signal GCK4 is supplied to the drain electrode of TFT_M12 of the drive circuit 301(n−1). Thus, the electric potential of netA(n) is decreased by ΔV due to the effect of parasitic capacitance between TFT_M12 of the drive circuit 301(n−1) and netC(n). Accordingly, the electric potential of netA(n) is set to "VDD−Vth1+ΔVbst".

At this point, the clock signal GCK2 supplied to the drain of TFT_M5 of the drive circuit 301(n+1) transitions to the H level electric potential. Thus, the electric potential of netA(n+1) of the drive circuit 301(n+1) is increased to "VDD−Vth1+ΔV+ΔVbst" along with the increase in the electric potential of the clock signal GCK2. Thus, the gate line GL(n) is charged to the H level (VDD) electric potential through TFT_M12 of the drive circuit 301(n).

While illustration is not provided, at time t4, charging of netC(n+2) of the drive circuit 301(n+2) is started. Accordingly, TFT_M3 of the drive circuit 301(n) is set to be in the ON state, and netA(n) is discharged to the L level (VSS) electric potential. In a case where the electric potential of netA(n) transitions to the L level, TFT_M9 is set to be in the OFF state. In addition, at this point, TFT_M8 is also in the OFF state. Accordingly, netB(n) transitions to an electric potential of "VDD−Vth6" (Vth6=threshold voltage of TFT_M6) through TFT_M6, and TFT_M10 is set to be in the ON state.

At this point, the electric potential of netA(n+1) is decreased by ΔV and is set to "VDD−Vth1+ΔVbst". In addition, the clock signal GCK1 transitions to the L level electric potential. Thus, the gate line GL(n) is discharged to the L level electric potential through TFT_M10 and TFT_M12 of the drive circuit 301(n).

Figure 5B:
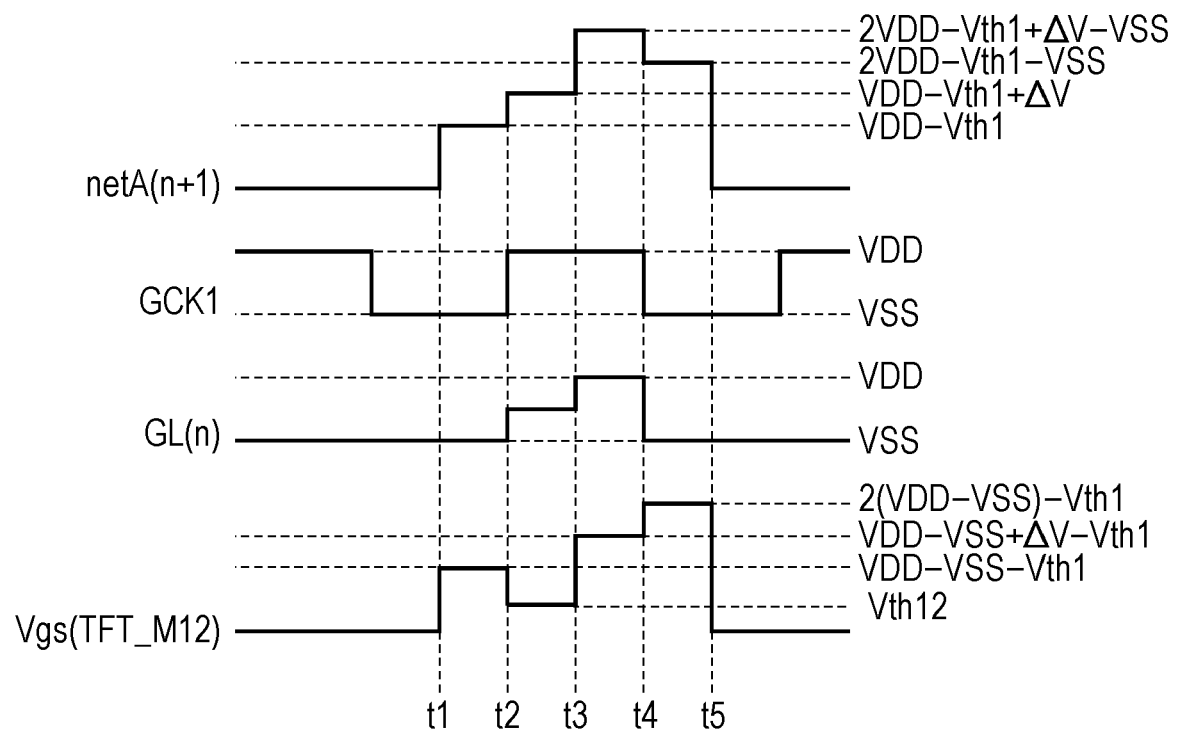
FIG. 5B is a view for describing a gate-source voltage of an output buffer unit of the drive circuit in the first embodiment.

FIG. 5B illustrates changes in the electric potentials of netA(n+1), the clock signal GCK1, the gate line GL(n), and the gate-source voltage (Vgs) of TFT_M12 of the drive circuit 301(n). Vgs represents a difference between the electric potential of netA(n+1) and the lower one of the electric potentials of the clock signal GCK1 and GL(n).

In a case where the efficiency of boosting accompanied by the parasitic capacitance is denoted by α, ΔVbst is represented by α×(VDD−VSS) (α<1). Here, α=1 is assumed for convenience of description. In a case where ΔVbst is set to (VDD−VSS), the electric potential of netA(n+1) in a case where the gate line GL(n) is discharged to the L level electric potential (t4) is set to "2VDD−Vth1−VSS". In a case where the gate line GL(n) is discharged to the L level electric potential, netA(n+1) has an electric potential higher than or equal to a difference in an electric potential between the L level (VSS) and the H level (VDD) with the L level (VSS) electric potential as a reference.

As illustrated in FIG. 5B, in a case where the gate line GL(n) is discharged to the L level electric potential (t4), Vgs is increased to "2(VDD−VSS)−Vth1" from "VDD−VSS+ΔV−Vth1". That is, as the electric potential of the clock signal GCK1 is decreased, the voltage applied to Vgs is increased.

Figure 5C:
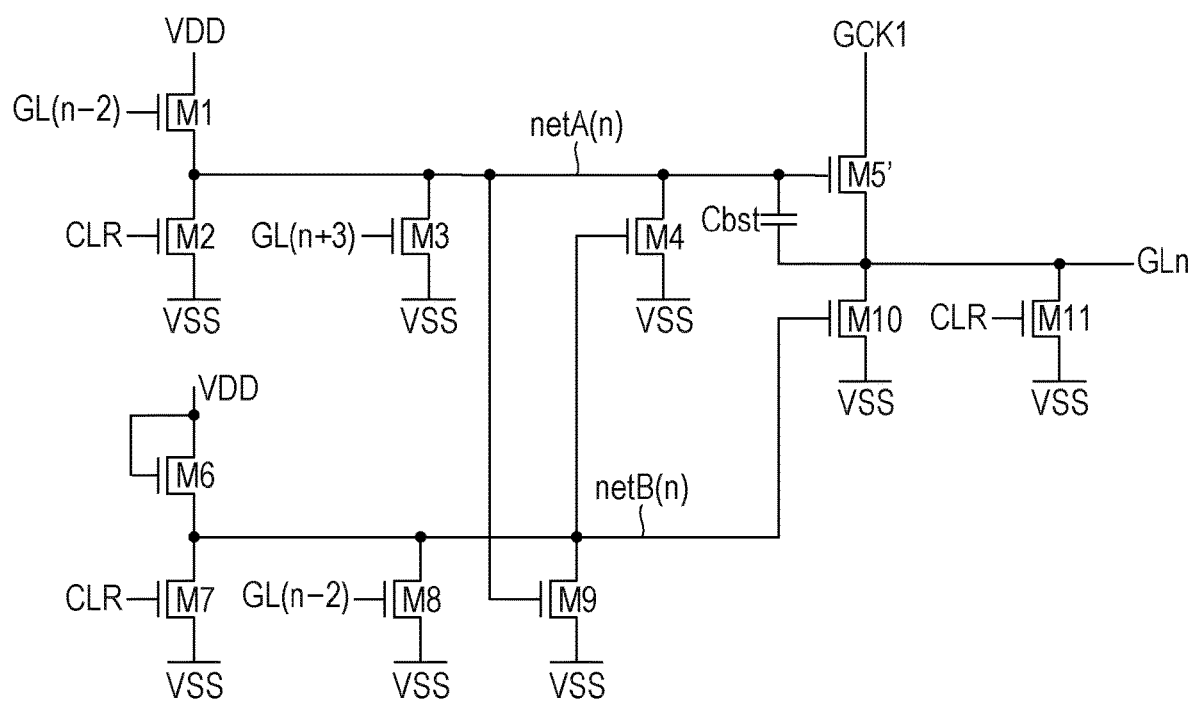
FIG. 5C is a view illustrating one example of an equivalent circuit of a drive circuit in the related art.

FIG. 5C is an equivalent circuit view of a general drive circuit in the related art. In FIG. 5C, configurations having the same function as the drive circuit 301 are designated by the same reference signs as the drive circuit 301.

As illustrated in FIG. 5C, in a drive circuit 400, netA(n) is connected to the gate line GL(n) through the capacitor Cbst, and the source electrode of TFT_M5' is connected to the gate line GL(n). That is, in the drive circuit 400, TFT_M5' functions as an output buffer unit BTn'.

Figure 5D:
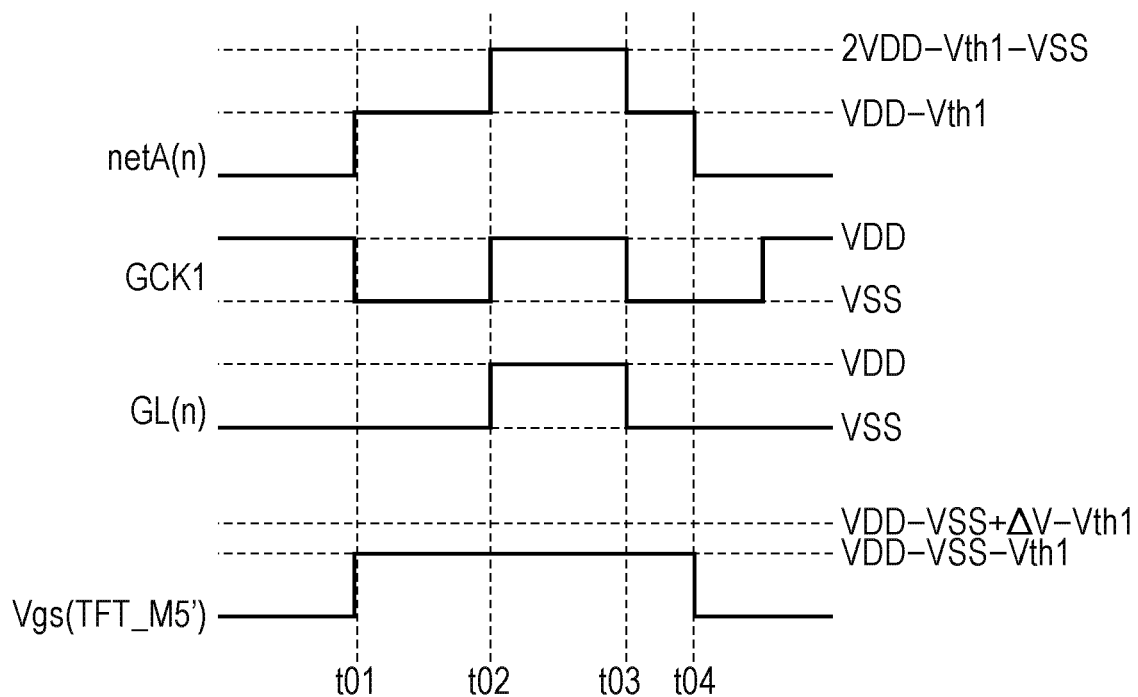
FIG. 5D is a view for describing a gate-source voltage of an output buffer unit of the drive circuit illustrated in FIG. 5C.

FIG. 5D is a waveform view illustrating changes in the electric potentials of netA(n), the clock signal GCK1, the gate line GL( ), and the gate-source voltage (Vgs) of TFT_M5' in the drive circuit 400.

As illustrated in FIG. 5D, netA(n) is precharged to an electric potential of "VDD−VSS−Vth1" through TFT_M1 at timing t01 at which the gate line GL(n−2) is set to be at the H level.

At timing t02 at which the clock signal GCK1 transitions to the H level electric potential, the electric potential of netA(n) is boosted through the capacitor Cbst. Consequently, the electric potential of netA(n) is increased to "VDD−VSS−Vth1+ΔVbst", that is, "2VDD−Vth1−VSS". Accordingly, the gate line GL(n) is charged to the H level (VDD) electric potential through TFT_M5'. At timing t12 at which the electric potential of the clock signal GCK1 transitions to the L level, the gate line GL(n) is discharged to the L level electric potential through TFT_M5'.

The gate-source voltage (Vgs) of TFT_M5' at timing t03 is "VDD−VSS−Vth1" as illustrated in FIG. 5D. Vth1 is sufficiently smaller than "VDD−VSS".

That is, in a case where the electric potential of the gate line GL(n) is decreased to the L level, Vgs of TFT_M12 in the drive circuit 300 in the present embodiment is set to a voltage that is approximately twice as high as Vgs of TFT_M5' of the drive circuit 400. Thus, in a case where the electric potential of the gate line GL is caused to transition to the L level from the H level, the drive circuit 300 in the present embodiment can cause a large amount of current to flow using the gate line GL through TFT_M12 and can decrease the electric potential of the gate line GL to the L level more promptly than the general drive circuit in the related art.

Second Embodiment

Figure 6A:
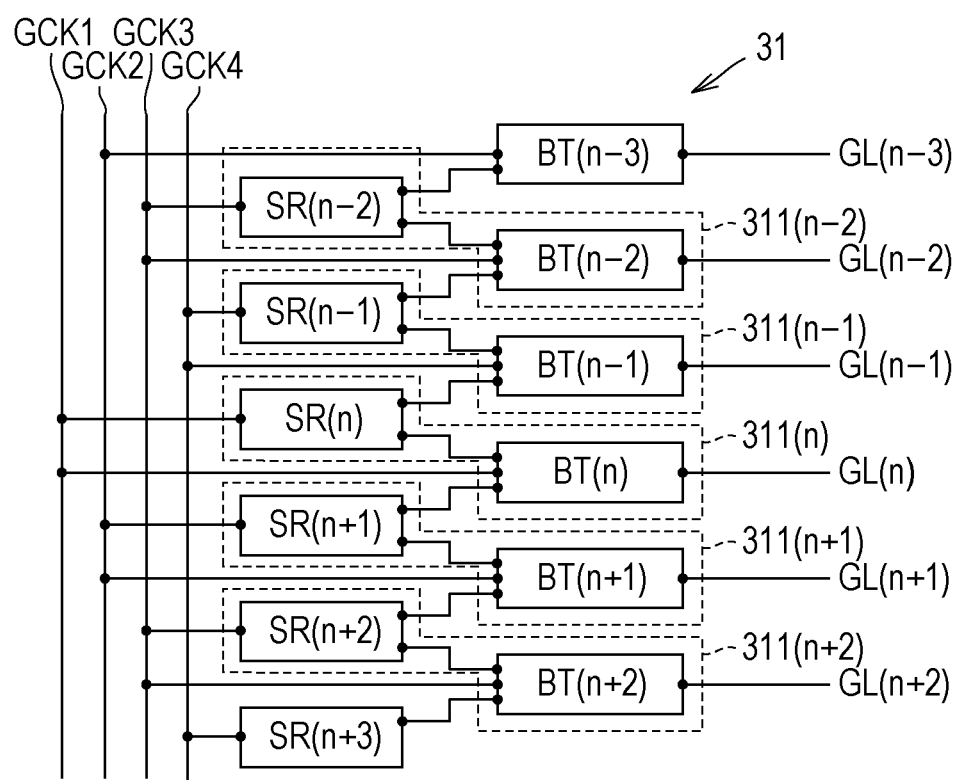
FIG. 6A is a schematic view illustrating a schematic configuration of a drive circuit in a second embodiment.

FIG. 6A is a schematic view illustrating a schematic configuration of each drive circuit of a gate driver 31 in the present embodiment. In FIG. 6A, for convenience, only drive circuits 311(n−2) to 311(n+2) that drive the gate lines GL(n−2) to GL(n+2) respectively are illustrated. Hereinafter, each drive circuit will be referred to as a drive circuit 311 when not distinguished from each other.

In the first embodiment, the shift register unit SR (refer to FIG. 3) of each drive circuit 301 is not connected to the output buffer unit BT of the drive circuit 301. Meanwhile, as illustrated in FIG. 6A, the shift register unit SR of each drive circuit 311 in the present embodiment is connected to the output buffer unit BT of the same drive circuit 311. Hereinafter, a specific configuration of each drive circuit 311 will be described particularly based on differences from the first embodiment.

Figure 6B:
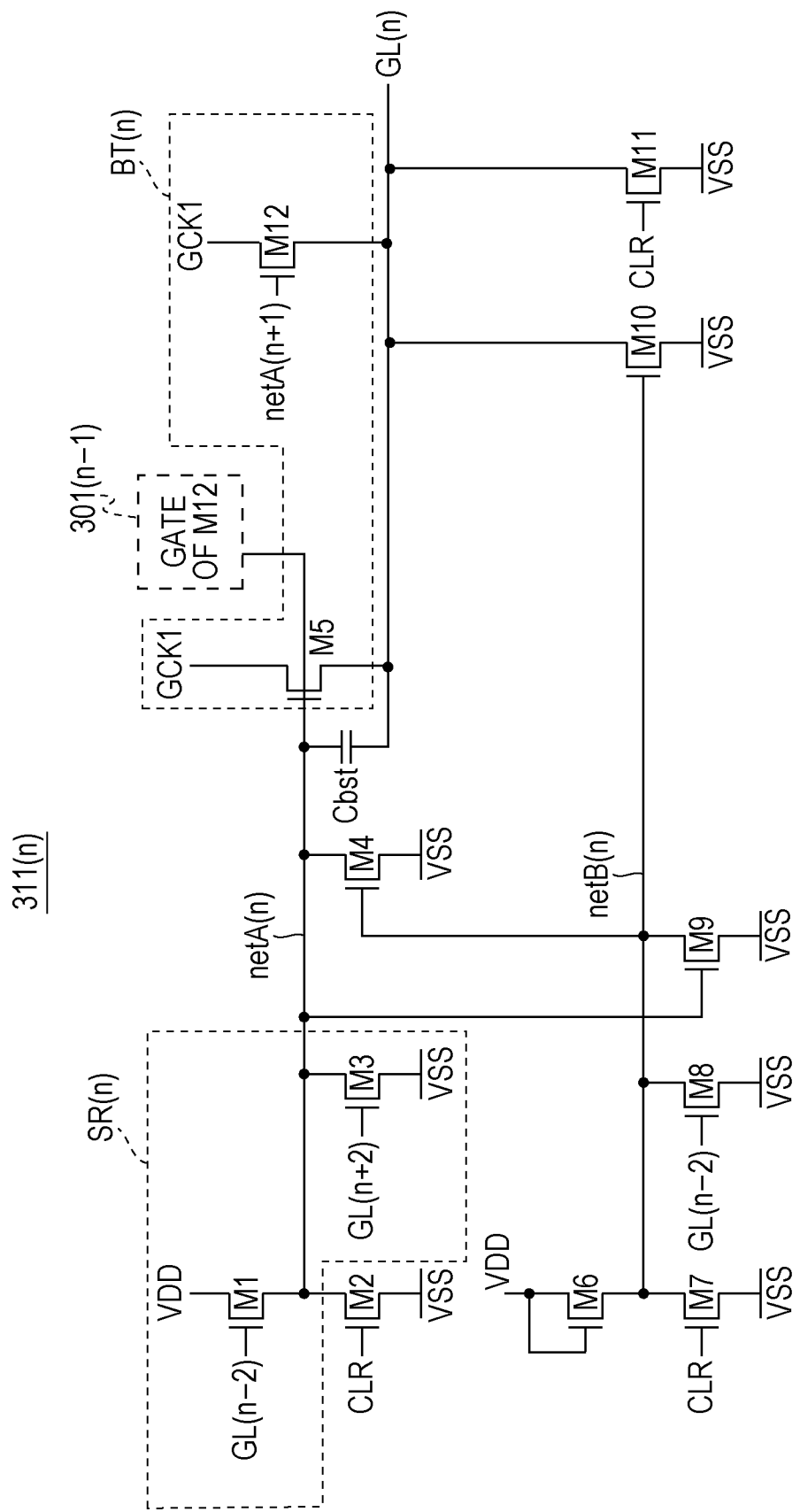
FIG. 6B is a view illustrating one example of an equivalent circuit of the drive circuit illustrated in FIG. 6A.

FIG. 6B is an equivalent circuit view of the drive circuit 311(n) that drives the gate line GL(n). Hereinafter, the operation of the drive circuit 311(n) will be described based on differences from each drive circuit 301 of the first embodiment.

As illustrated in FIG. 6B, in the drive circuit 311(n), the source electrode of TFT_M5 and one electrode of the capacitor Cbst are connected to the gate line GL(n), and TFT_M13, TFT_M14, and netC(n) are not disposed. In the present embodiment, the output buffer unit BT(n) is configured with two TFTs of TFT_M5 and TFT_M12. TFT_M5 of the output buffer unit BT(n) is connected to netA(n) and is connected to the shift register unit SR(n).

In addition, the gate electrodes of TFT_M1 and TFT_M8 in the drive circuit 311(n) are connected to the gate line GL(n−2), and the gate electrode of TFT_M3 is connected to the gate line GL(n+2).

Figure 7A:
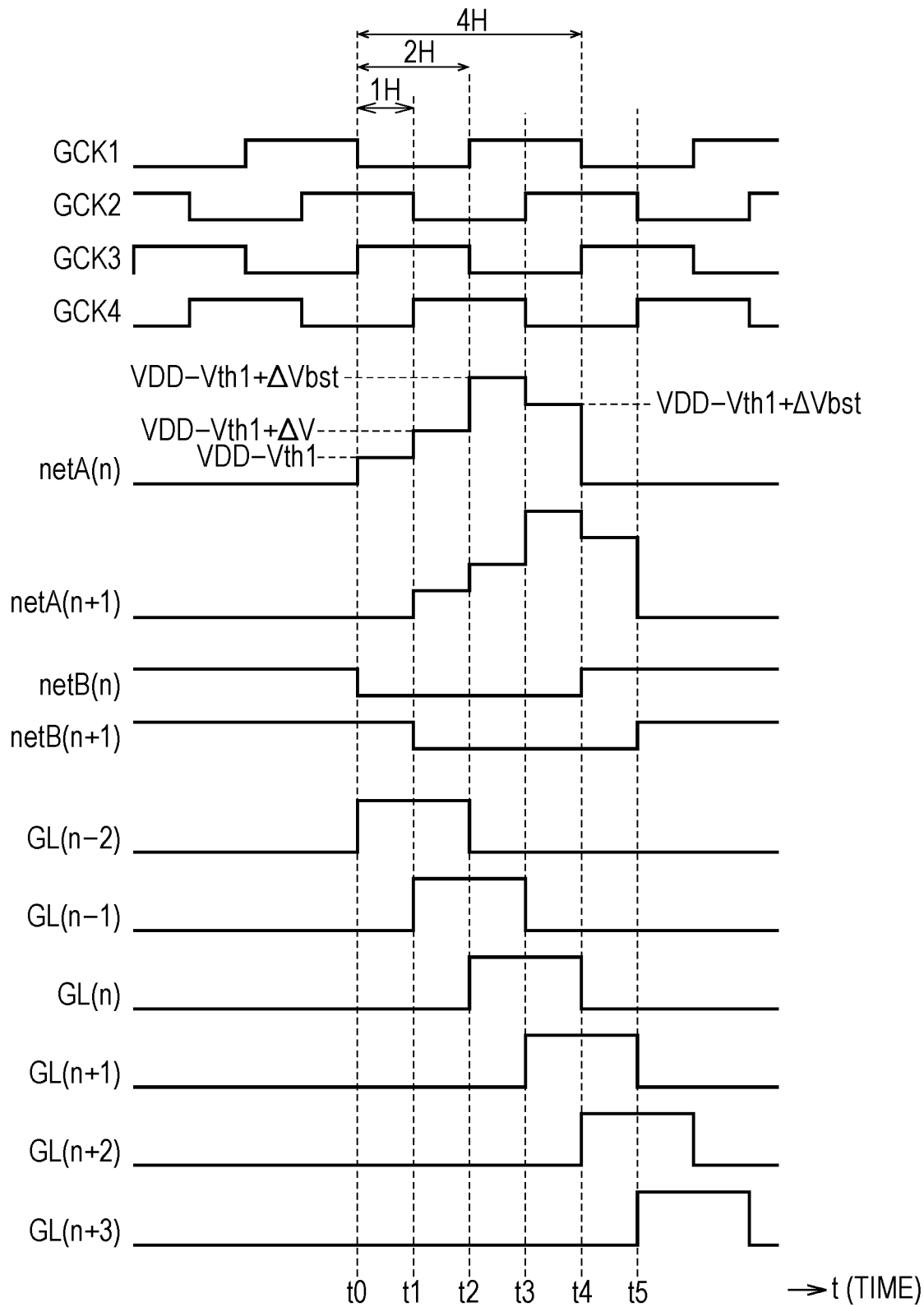
FIG. 7A is a timing chart in a case where the drive circuit illustrated in FIG. 6B drives a gate line.

FIG. 7A is a timing chart in a case where the drive circuit 311(n) drives the gate line GL(n).

At time t0, in a case where the gate line GL(n−2) starts being charged to the H level electric potential, TFT_M1 is set to be in the ON state. Accordingly, netA(n) is precharged to an electric potential of "VDD−Vth1" that is lower than the electric potential (VDD) of the gate line GL(n−2) by the threshold voltage Vth1 of TFT_M1.

At time t1, the clock signal GCK4 transitions to the H level electric potential from the L level. Accordingly, in the same manner as the first embodiment, parasitic capacitance between TFT_M12 of the drive circuit 311(n−1) and netA(n) increases the electric potential of netA(n) to "VDD−Vth1+ΔV".

At time t2, the electric potential of the clock signal GCK1 transitions to the H level, and the gate line GL(n) transitions to the H level electric potential through TFT_M5. In addition, the electric potential of netA(n) is increased to "VDD−Vth1+ΔV+ΔVbst" through the capacitor Cbst. Accordingly, the drain and the source of TFT_M5 are conducted to each other, and the gate line GL(n) is charged to the H level (VDD) electric potential.

At time t3, the clock signal GCK4 transitions to the L level electric potential. Accordingly the electric potential of netA(n) is set to "VDD−Vth1+ΔVbst" due to the effect of parasitic capacitance between TFT_M12 of the drive circuit 311(n−1) and netC(n). At this point, the electric potential of netA(n+1) is increased to "VDD−Vth1+ΔV+ΔVbst", and the H level (VDD) electric potential is charged to the gate line GL(n) through TFT_M12.

At time t4, the gate line GL(n+2) is charged to the H level electric potential. Accordingly, TFT_M3 is set to be in the ON state, and netA(n) is discharged to the L level (VSS) electric potential. At this point, the electric potential of the clock signal GCK1 transitions to the L level, and the gate line GL(n) is discharged to the L level electric potential through TFT_M12.

Figure 7B:
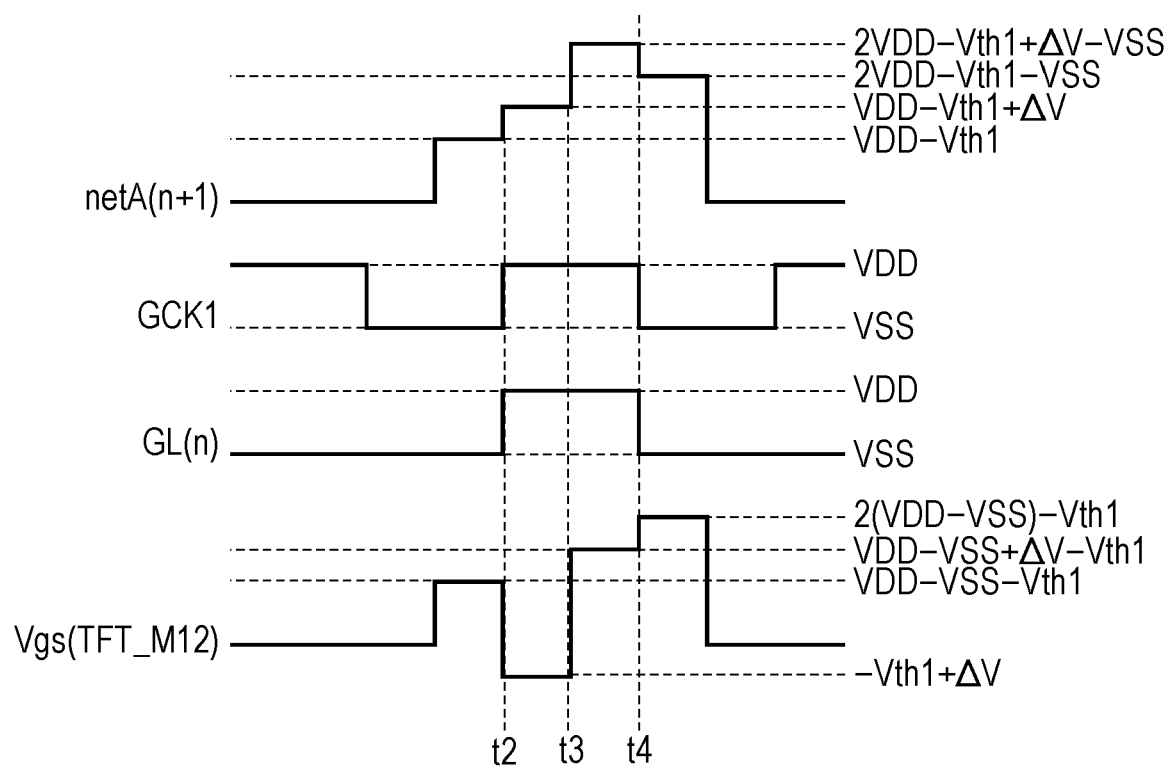
FIG. 7B is a view for describing a gate-source voltage of an output buffer unit of the drive circuit in the second embodiment.

FIG. 7B illustrates changes in the electric potentials of netA(n+1), the clock signal GCK1, the gate line GL(n), and the gate-source voltage (Vgs) of TFT_M12 of the drive circuit 311(n). In FIG. 7B, parts other than the waveform of the gate line GL(n) are the same as those in the first embodiment.

As illustrated in FIG. 7B, even in the present embodiment, the gate-source voltage (Vgs) of TFT_M12 is "2(VDD−VSS)−Vth1" in a case where the electric potential of the gate line GL(n) transitions to the L level (t4). Thus, in the same manner as the first embodiment, in a case where the gate line GL(n) is caused to transition to the L level electric potential, a higher voltage than in the related art can be applied to the gate electrode of TFT_M12 of the buffer unit, and the electric potential of the gate line GL(n) can be promptly decreased.

In addition, in the present embodiment, the gate line GL(n) is caused to transition to the H level or L level electric potential using TFT_M12 and TFT_M5 as the output buffer unit BT. Thus, the amount of time for causing the gate line GL(n) to transition to the H level electric potential can be reduced, compared to that in the case of using only TFT_M12. Consequently, a voltage margin for switching the gate line GL(n) to be in the selected state is improved, compared to that in the case of configuring the output buffer unit BT with only TFT_M12.

Third Embodiment

While the case of reducing the amount of time for decreasing the gate line GL to the L level electric potential from the H level is described in the first and second embodiments, a configuration that more promptly switches the gate line GL to be in the selected state will be described in the present embodiment.

Figure 8A:
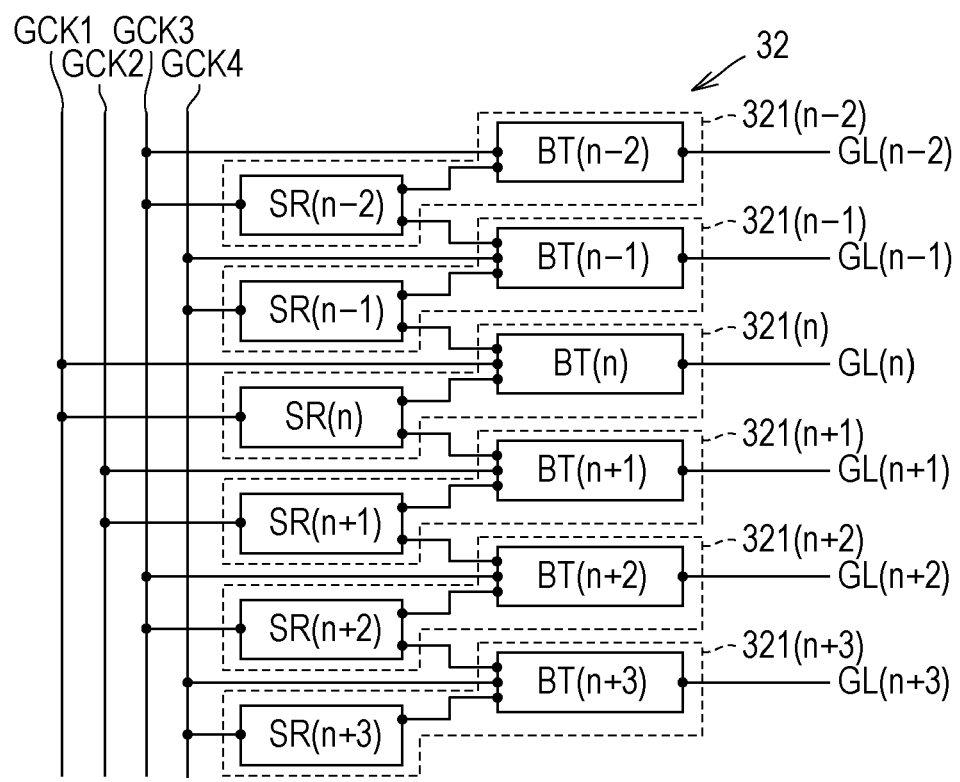
FIG. 8A is a schematic view illustrating a schematic configuration of a drive circuit in a third embodiment.

FIG. 8A is a schematic view illustrating a schematic configuration of each drive circuit of a gate driver 32 in the present embodiment. In FIG. 8A, for convenience, only drive circuits 321(n−2) to 321(n+3) that drive the gate lines GL(n−2) to GL(n+3) respectively are illustrated. Each drive circuit will be referred to as a drive circuit 321 when not distinguished from each other. Hereinafter, configurations that are different from the second embodiment will be particularly described.

As illustrated in FIG. 8A, the shift register unit SR(n) of the drive circuit 321(n) is connected to the output buffer unit BT(n+1) of the drive circuit 321(n+1) in the subsequent stage, and the output buffer unit BT(n) is connected to the shift register unit SR(n−1) of the drive circuit 321(n−1) in the previous stage. Hereinafter, a specific configuration of each drive circuit 321 will be described.

Figure 8B:
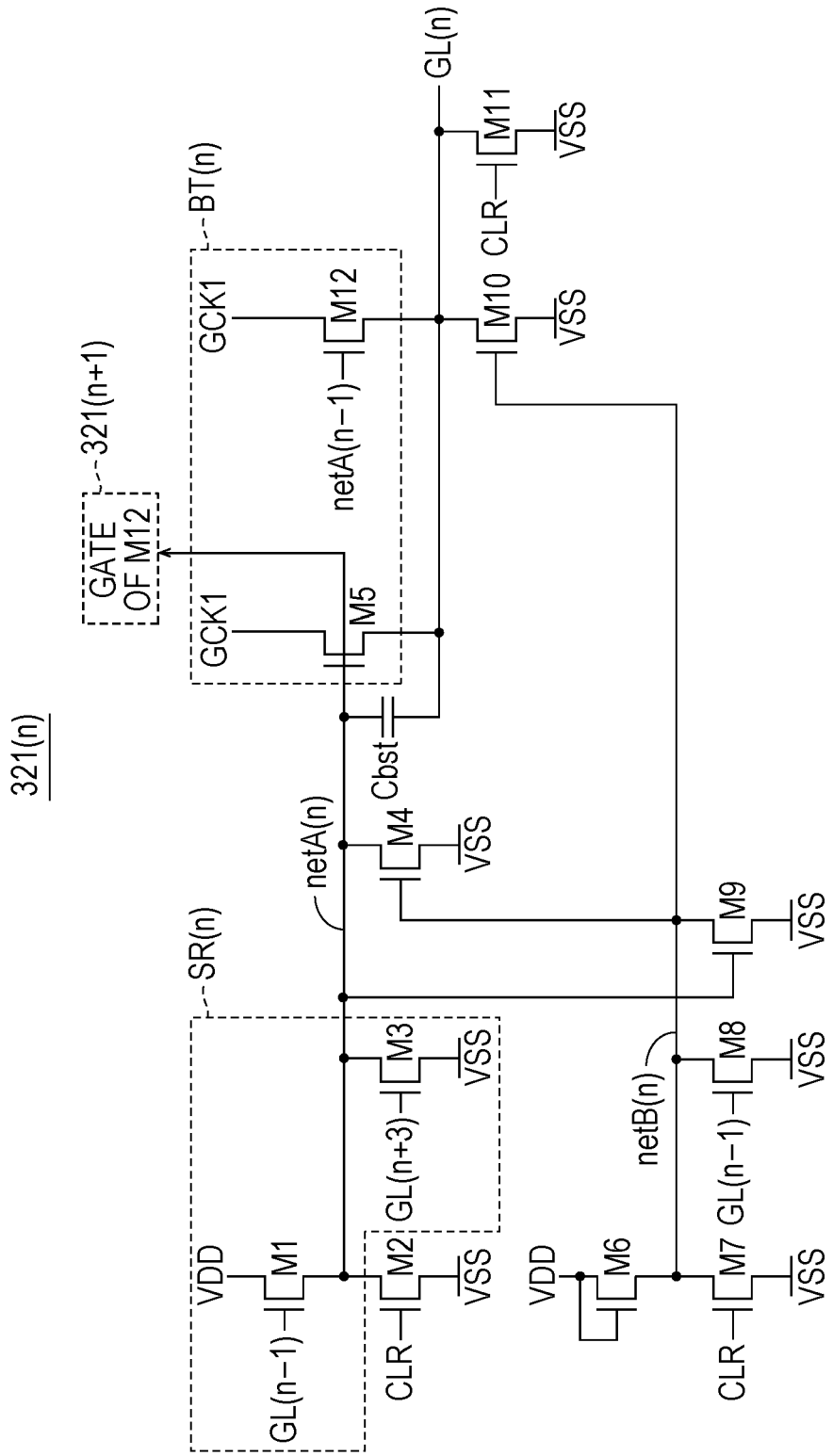
FIG. 8B is an equivalent circuit view of the drive circuit illustrated in FIG. 8A.

FIG. 8B is an equivalent circuit view of the drive circuit 321(n). In the drive circuit 321(n), the same configurations as the second embodiment are designated by the same reference signs as the first embodiment.

As illustrated in FIG. 8B, the gate electrode of TFT_M12 in the output buffer unit BT(n) is connected to netA(n−1) of the drive circuit 321(n−1). In addition, netA(n) of the shift register unit SR(n) is connected to the gate electrode of TFT_M12 in the output buffer unit BT(n+1) of the drive circuit 321(n+1).

The gate electrodes of TFT_M1 and TFT_M8 are connected to the gate line GL(n−1), and the gate electrode of TFT_M3 is connected to the gate line GL(n+3).

Figure 9A:
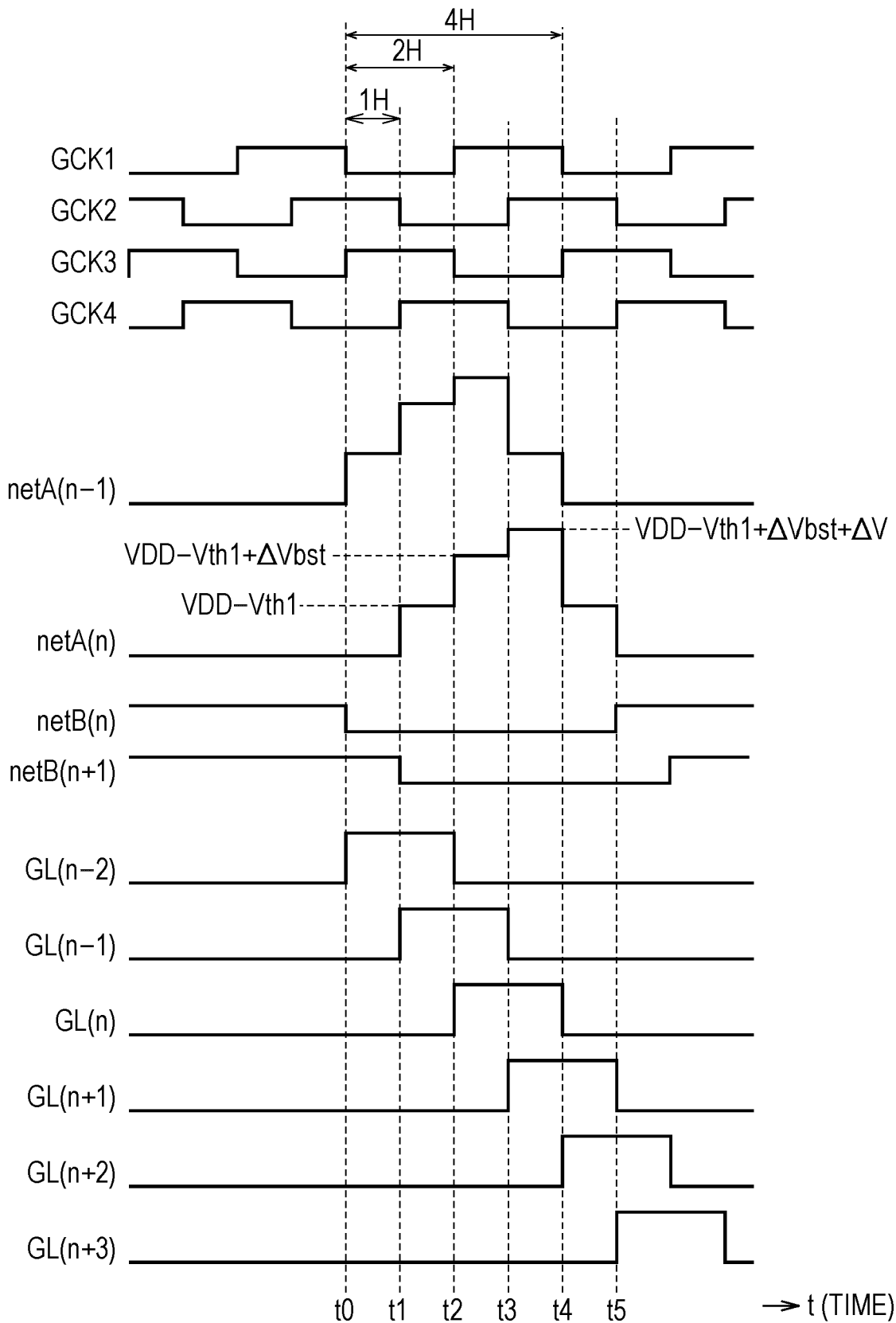
FIG. 9A is a timing chart in a case where the drive circuit illustrated in FIG. 8B drives a gate line.

FIG. 9A is a timing chart in a case where the drive circuit 321(n) drives the gate line GL(n). Hereinafter, an operation that is different from the second embodiment will be described.

At time t0, in a case where the gate line GL(n−2) starts being charged to the H level electric potential, TFT_M1 of the drive circuit 321(n−1) is set to be in the ON state, and netA(n−1) is precharged to "VDD−Vth1".

Similarly, at time t1, in a case where the gate line GL(n−1) starts being charged to the H level electric potential, netA(n) is precharged to "VDD−Vth1". In addition, by the charging of the gate line GL(n−1), TFT_M8 of the drive circuit 321(n) is set to be in the ON state, and netB(n) is charged to the L level electric potential.

In addition, the clock signal GCK4 transitions to the H level electric potential from the L level. Accordingly, the gate line GL(n−1) is charged to the H level electric potential through TFT_M5 and TFT_M12 of the drive circuit 321(n−1). Along with the charging of the gate line GL(n−1), the electric potential of netA(n−1) is increased to "VDD−Vth1+ΔV" through the capacitor Cbst of the drive circuit 321(n−1).

At this point, while TFT_M5 and TFT_M12 in the drive circuit 321(n) are in the ON state, the clock signal GCK1 has the L level electric potential. Thus, the gate line GL(n) maintains the L level electric potential.

At time t2, the clock signal GCK1 transitions to the H level electric potential. At this point, the electric potential of netA(n−1) is increased to "VDD−Vth1+ΔVbst+ΔV" due to parasitic capacitance between netA(n−1) and TFT_M12 of the drive circuit 321(n). Thus, a larger amount of current can be caused to flow in TFT_M12 of the drive circuit 321(n) along with the increase in the electric potential of the clock signal GCK1, and the electric potential of the gate line GL(n) can be caused to promptly transition to the H level.

At time t3, the clock signal GCK2 is changed to the H level electric potential from the L level. The clock signal GCK2 is supplied to the drive circuit 321(n+1). Thus, the electric potential of netA(n) is increased to "VDD−Vth1+ΔVbst+ΔV" due to parasitic capacitance between TFT_M12 of the drive circuit 321(n+1) and netA(n).

In addition, at this point, the clock signal GCK4 is changed to the L level electric potential from the H level. Thus, the electric potential of netA(n−1) is decreased to "VDD−Vth1" through TFT_M5 and TFT_M12 of the drive circuit 321(n−1).

At time t4, the clock signal GCK1 transitions to the L level from the H level. Accordingly, the electric potential of netA(n) is decreased to "VDD−Vth1" through TFT_M5 and TFT_M12 of the drive circuit 321(n). At this point, the gate line GL(n+2) starts being charged to the H level electric potential. Thus, TFT_M3 of the drive circuit 321(n−1) is set to be in the ON state, and netA(n−1) transitions to the L level electric potential.

In addition, at this point, TFT_M7 and TFT_M8 of the drive circuit 321(n) are in the OFF state, and TFT_M6, TFT_M9, and TFT_M5 of the drive circuit 321(n) are in the ON state. At this point, netB(n) maintains the L level electric potential through TFT_M9. The gate line GL(n) is discharged to the L level electric potential through TFT_M5, and the electric potential of netA(n) is decreased to VDD−Vth1 through the capacitor Cbst.

Figure 9B:
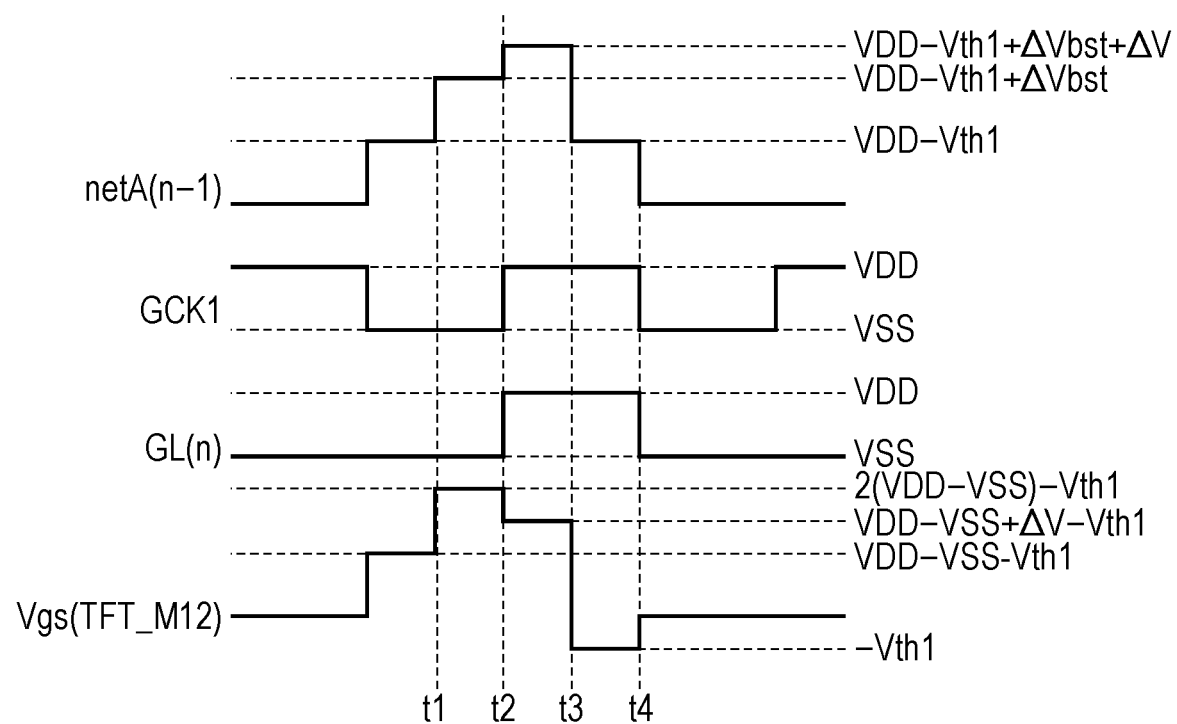
FIG. 9B is a view for describing a gate-source voltage of an output buffer unit of the drive circuit in the third embodiment.

FIG. 9B illustrates changes in the electric potentials of netA(n−1), the clock signal GCK1, the gate line GL(n), and the gate-source voltage (Vgs) of TFT_M12 of the drive circuit 321(n) in the present embodiment.

As illustrated in FIG. 9B, in the present embodiment, Vgs of TFT_M12 is set to "2(VDD−VSS)−Vth1" before the electric potential of the gate line GL(n) is caused to transition to the H level from the L level (t1 to t2). Thus, in the present embodiment, the gate line GL(n) can be charged in a state where the ON voltage of TFT_M12 is approximately twice as high as Vgs of TFT_M5' of the drive circuit 400 in the related art illustrated in FIG. 5D. Consequently, the gate line GL(n) can be caused to transition to the H level electric potential more promptly than that in the drive circuit 400 in the related art.

Fourth Embodiment

In the above embodiments, the case of reducing the amount of time for discharging the gate line GL to the L level electric potential from the H level or the amount of time for charging the gate line GL to the H level from the L level is described. In the present embodiment, a configuration that switches the gate line GL(n) to be in the selected state and the unselected state more promptly will be described.

Figure 10A:
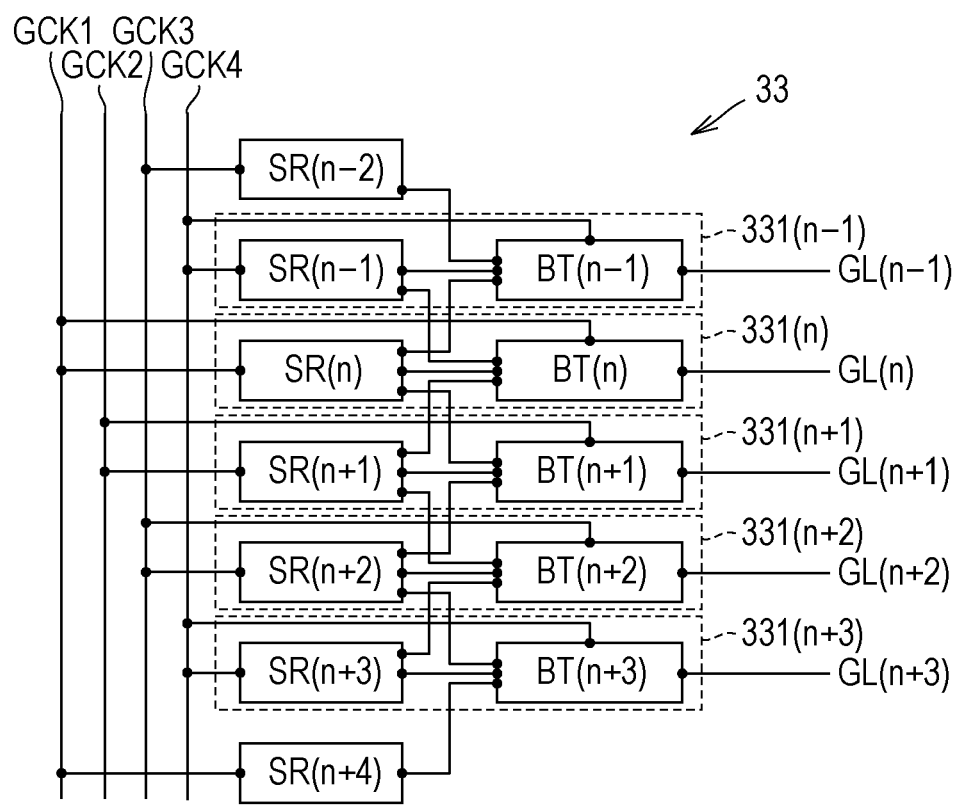
FIG. 10A is a schematic view illustrating a schematic configuration of a drive circuit in a fourth embodiment.

FIG. 10A is a schematic view illustrating a schematic configuration of each drive circuit of a gate driver 33 in the present embodiment. In FIG. 10A, for convenience, only drive circuits 331(n−1) to 331(n+3) that drive the gate lines GL(n−1) to GL(n+3) respectively are illustrated. Each drive circuit will be referred to as a drive circuit 331 when not distinguished from each other. Hereinafter, configurations that are different from the above embodiments will be described.

As illustrated in FIG. 10A, the shift register unit SR(n) of the drive circuit 331(n) is connected to the output buffer unit BT(n), the output buffer unit BT(n−1) of the drive circuit 331(n−1) in the previous stage, and the output buffer unit BT(n+1) of the drive circuit 331(n+1) in the subsequent stage. Hereinafter, a configuration of each drive circuit 331 will be specifically described.

Figure 10B:
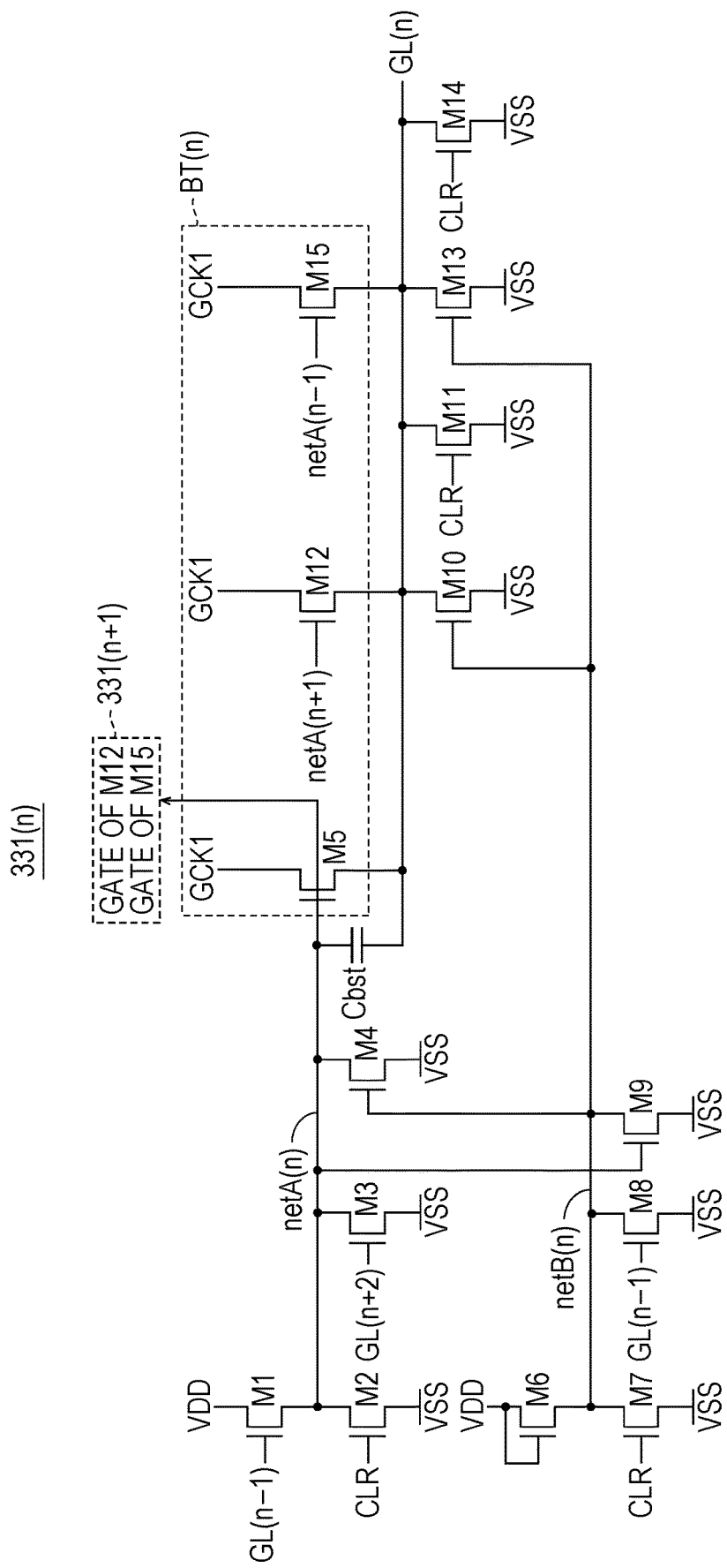
FIG. 10B is an equivalent circuit view of the drive circuit illustrated in FIG. 10A.

FIG. 10B is an equivalent circuit view of the drive circuit 331(n). In the drive circuit 331(n), the same configurations as the above embodiments are designated by the same reference signs as the above embodiments. Hereinafter, configurations that are different from the above embodiments will be described.

As illustrated in FIG. 10B, the drive circuit 331(n) further includes TFT_M13 to TFT_M15 in addition to TFT_M1 to TFT_M12.

TFT_M15 functions as the output buffer unit BT(n) in the same manner as TFT_M5 and TFT_M12. TFT_M15 is configured by connecting its gate electrode to netA(n−1), supplying the clock signal GCK1 to its drain electrode, and connecting its source electrode to the gate line GL(n).

That is, in the present embodiment, TFT_M15 operates in the same manner as TFT_M12 of the third embodiment, and TFT_M12 operates in the same manner as TFT_M12 of the second embodiment.

TFT_m13 is configured by connecting its gate electrode to netB(n), connecting its drain electrode to the gate line GL(n), and supplying the power supply voltage VSS to its source electrode.

TFT_M14 is configured by supplying the reset signal CLR to its gate electrode, connecting its drain electrode to the gate line GL(n), and supplying the power supply voltage VSS to its source electrode.

The gate electrodes of TFT_M1 and TFT_M8 are connected to the gate line GL(n−1), and the gate electrode of TFT_M3 is connected to the gate line GL(n+2).

In addition, netA(n) is connected to the gate electrode of TFT_M12 of the drive circuit 331(n−1) and is connected to the gate electrode of TFT_M15 of the drive circuit 331(n+1).

Figure 11A:
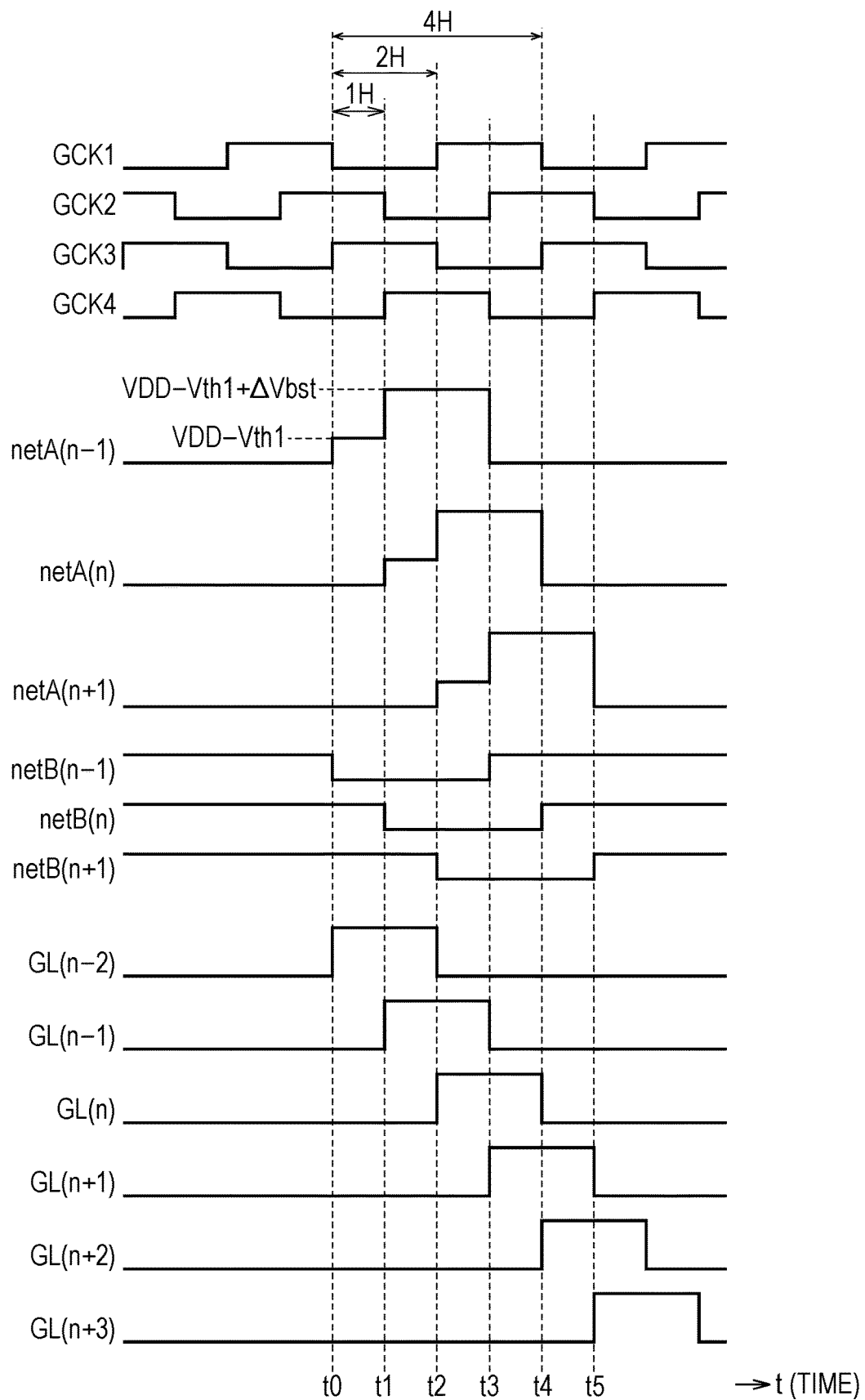
FIG. 11A is a timing chart in a case where the drive circuit illustrated in FIG. 10B drives a gate line.

FIG. 11A is a timing chart in a case where the drive circuit 331(n) drives the gate line GL(n). As illustrated in FIG. 11A, changes in electric potential in the present embodiment after netA(n) is precharged are different from those in the above embodiments. Hereinafter, a specific description will be provided.

At time t0, in a case where the gate line GL(n−2) starts being charged to the H level electric potential, TFT_M1 of the drive circuit 331(n−1) is set to be in the ON state, and netA(n−1) is precharged to "VDD−Vth1".

At time t1, in a case where the gate line GL(n−1) starts being charged to the H level electric potential, netA(n) is precharged to "VDD−Vth1" in the same manner as netA(n−1). In addition, by the charging of the gate line GL(n−1), TFT_M8 of the drive circuit 331(n) is set to be in the ON state, and netB(n) is charged to the L level electric potential.

In addition, at time t1, the clock signal GCK2 transitions to the L level electric potential, and the clock signal GCK4 transitions to the H level electric potential. The gate line GL(n−1) is charged to the H level electric potential.

The clock signal GCK4 is supplied to TFT_M12 of the drive circuit 331(n−1), and the clock signal GCK2 is supplied to TFT_M15 of the drive circuit 331(n+1). Thus, netA(n) is affected by changes in the electric potentials of the clock signal GCK4 and the clock signal GCK2 through parasitic capacitance between the TFTs. However, the clock signal GCK4 and the clock signal GCK2 are in opposite phases. Thus, in a case where TFT_M12 and TFT_M15 have the same size, and parasitic capacitance between netA(n) and each of TFT_M12 and TFT_M15 is equivalent, the effect of changes in the electric potentials of the clock signal GCK4 and the clock signal GCK2 is canceled out, and netA(n) is not affected by the changes in the electric potentials of these clock signals.

At time t2, the clock signal GCK1 transitions to the H level electric potential, and the H level electric potential starts being charged to the gate line GL(n) through TFT_M5. Accordingly, the electric potential of netA(n) is increased to "VDD−Vth1+ΔVbst" through the capacitor Cbst.

At this point, the electric potential of netA(n−1) is "VDD−Vth1+ΔVbst". Thus, TFT_M15 of the drive circuit 331(n) is set to be in the ON state. Furthermore, at this point, netA(n+1) is precharged to an electric potential of "VDD−Vth1", and TFT_M12 of the drive circuit 331(n) is set to be in the ON state. Thus, the H level electric potential is charged to the gate line GL(n) through TFT_M12, TFT_M15, and TFT_M5.

At time t3, the gate line GL(n−1) transitions to the L level electric potential, and TFT_M1 is set to be in the OFF state. At this point, the clock signal GCK1 has the H level electric potential, and the H level electric potential is charged to the gate line GL(n) through TFT_M15. In the period of time t2 to t4 during which the electric potential of the clock signal GCK1 is at the H level, the gate line GL(n) is continuously charged to the H level electric potential.

While the H level electric potential is charged to the gate line GL(n), netA(n) maintains an electric potential of "VDD−Vth1+ΔVbst" through the capacitor Cbst.

At time t4, the clock signal GCK1 transitions to the L level electric potential, and the gate line GL(n+2) starts being charged to the H level electric potential. Accordingly, TFT_M3 of the drive circuit 331(n) is set to be in the ON state, and netA(n) transitions to the L level electric potential. In addition, at this point, while netA(n−1) has the L level electric potential, netA(n+1) has an electric potential of "VDD−Vth1+ΔVbst". Thus, the electric potential of the gate line GL(n) is discharged to the L level through TFT_M12 of the drive circuit 331(n).

The gate line GL(n−1) maintains the L level electric potential from time t3. Thus, TFT_M8 is set to be in the OFF state, and netB(n) is set to have the H level electric potential. Accordingly, TFT_M4, TFT_M10, and TFT_M13 of the drive circuit 331(n) are set to be in the ON state. Thus, from time t4, netA(n) maintains the L level electric potential through TFT_M4, and the gate line GL(n) maintains the L level electric potential through TFT_M10 and TFT_M13.

Figure 11B:
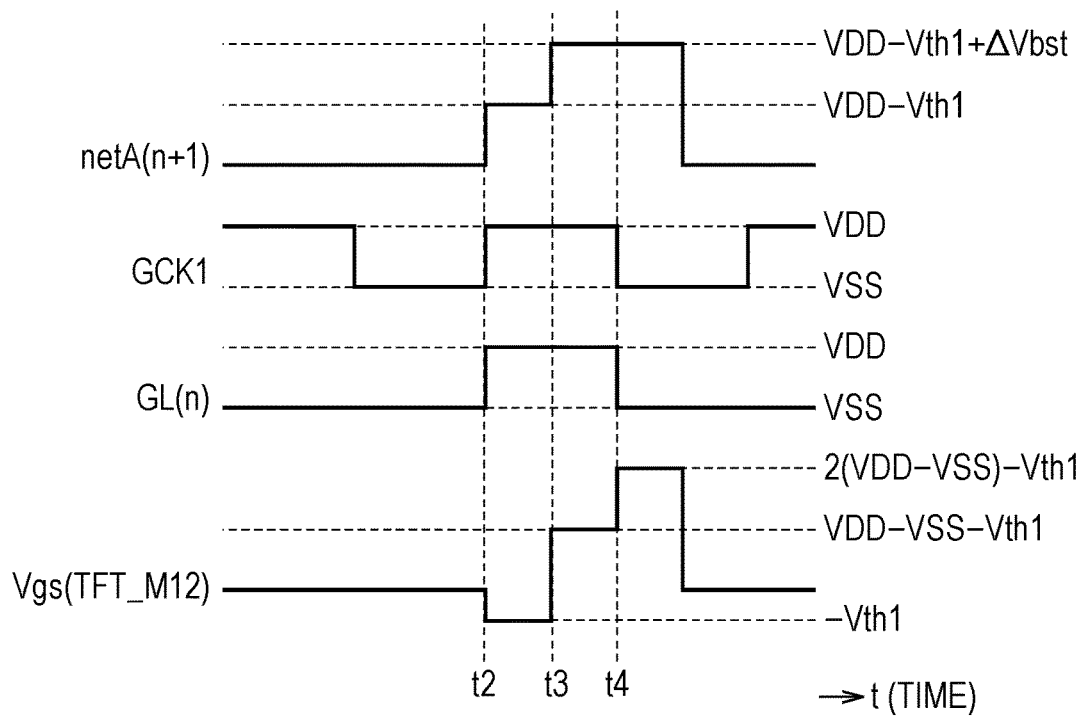
FIG. 11B is a view for describing a gate-source voltage of an output buffer unit of the drive circuit in the fourth embodiment.

FIG. 11B illustrates changes in the electric potentials of netA(n+1), the clock signal GCK1, the gate line GL(n), and Vgs of TFT_M12 in the present embodiment. In addition, FIG. 11C illustrates changes in the electric potentials of netA(n−1), the clock signal GCK1, the gate line GL(n), and Vgs of TFT_M15 in the present embodiment.

As illustrated in FIG. 11B, at a timing (t2) at which the gate line GL(n) is caused to transition to the H level electric potential from the L level, Vgs of TFT_M12 is set to "2(VDD−VSS)−Vth1". Thus, in the present embodiment, the gate line GL(n) can be charged in a state where the ON voltage of TFT_M12 is approximately twice as high as Vgs of TFT_M5' of the drive circuit 400 in the related art illustrated in FIG. 5D. Consequently, the gate line GL(n) can be caused to transition to the H level electric potential more promptly than that in the drive circuit 400 in the related art.

Figure 11C:
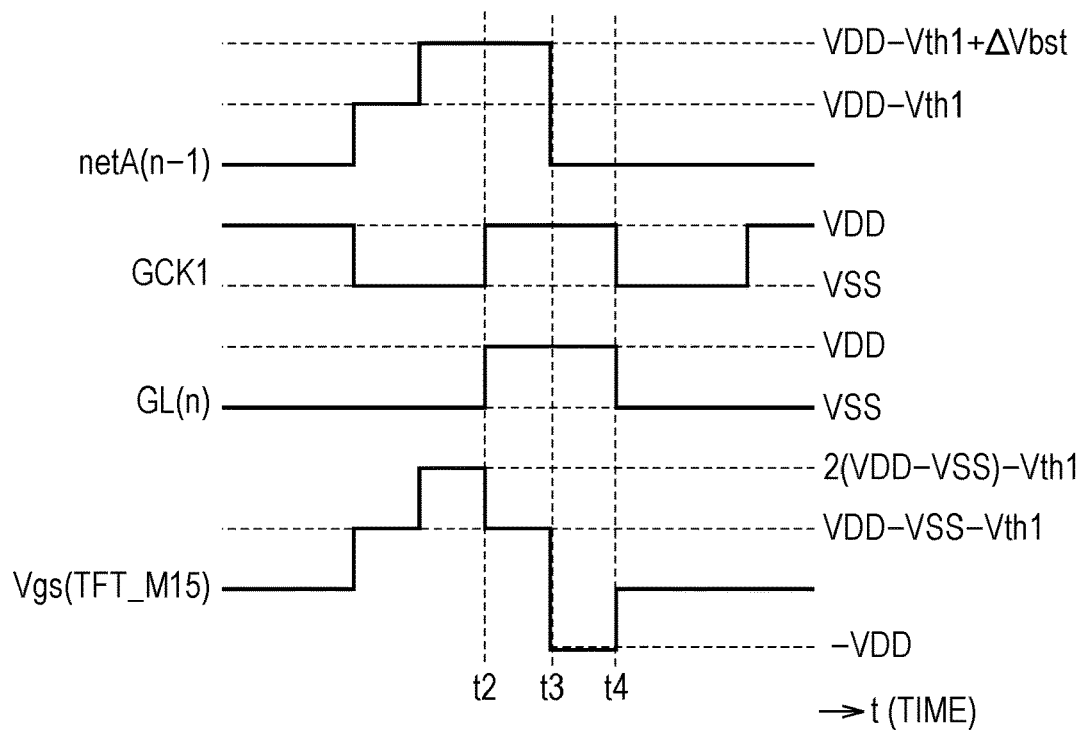
FIG. 11C is a view for describing the gate-source voltage of the output buffer unit of the drive circuit in the fourth embodiment.

In addition, as illustrated in FIG. 11C, at a timing (t4) at which the gate line GL(n) is caused to transition to the L level electric potential from the H level, Vgs of TFT_M15 is set to "2(VDD−VSS)−Vth1". Thus, the gate line GL(n) can be discharged in a state where the ON voltage of TFT_M15 is approximately twice as high as that in the drive circuit in the related art. Consequently, the gate line GL(n) can be caused to transition to the L level electric potential more promptly than that in the drive circuit in the related art.

The drive circuit 331(n) includes, as the output buffer unit BT(n), TFT_M15 that is driven depending on the electric potential of netA(n−1) of the drive circuit 331(n−1) in the previous stage, and TFT_M12 that is driven depending on the electric potential of netA(n+1) of the drive circuit 331(n+1) in the subsequent stage. In a case where the gate line GL(n) is switched to be in the selected state, the electric potential of netA(n+1) is "VDD−Vth1+ΔVbst (ΔVbst=VDD−VSS)" and is higher than VDD. In addition, in a case where the gate line GL(n) is switched to be in the unselected state, the electric potential of netA(n−1) is "VDD−Vth1+ΔVbst (ΔVbst=VDD−VSS)" and is higher than VDD. Thus, the present embodiment can switch the gate line GL(n) to be in the selected state and the unselected state more promptly than the drive circuit 400 in the related art.

Fifth Embodiment

In the above embodiments, an example in which the gate driver is disposed in an area on one end part side of the gate lines GL in the area (hereinafter, the picture-frame area) outside the display area D is described. In the present embodiment, an example in which the gate driver is disposed in areas at both ends of the gate lines GL in the picture-frame area will be described.

Figure 12:
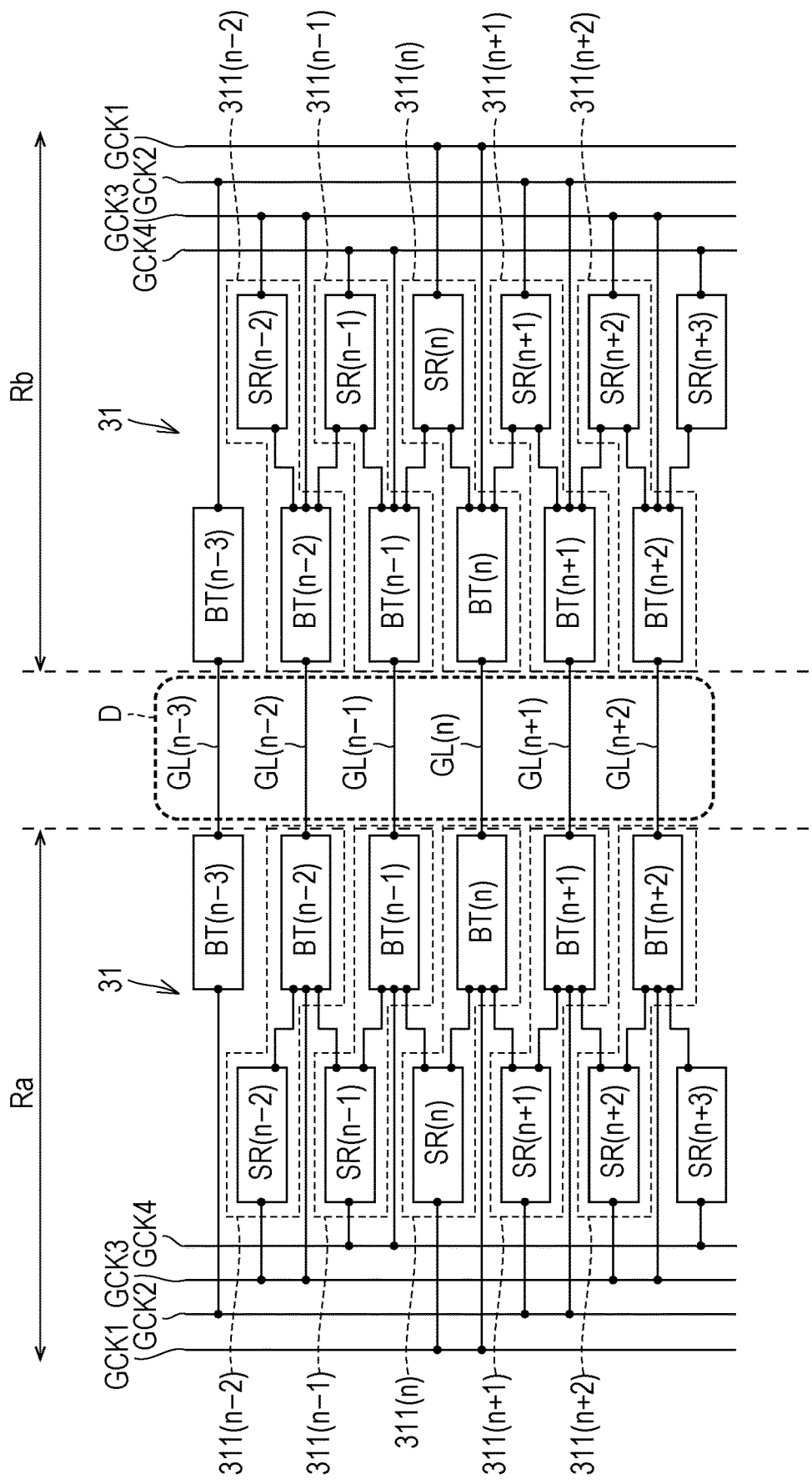
FIG. 12 is a schematic view illustrating an example of arrangement of a gate driver in a fifth embodiment.

FIG. 12 is a schematic view illustrating an example of arrangement of the gate driver in the present embodiment. In FIG. 12, an example of arrangement of the drive circuits 311 of the gate driver 31 in the second embodiment is illustrated.

As illustrated in FIG. 12, for one gate line GL, two drive circuits 311 that drive the gate line GL are disposed in picture-frame areas Ra and Rb on both end sides of the gate line GL.

In addition, the same clock signal is supplied to the two drive circuits 311. The two drive circuits 311 corresponding to one gate line GL are driven approximately at the same time and drives the one gate line GL.

By such a configuration, the gate lines GL can be driven more promptly than in a case where one gate line GL is driven by one drive circuit 311, and reliability can be improved.

Sixth Embodiment

In the fifth embodiment, an example in which two drive circuits for each gate line GL are arranged in the picture-frame areas Ra and Rb respectively is described. In the present embodiment, an example in which drive circuits that drive the gate lines GL in the odd-numbered rows are arranged in one picture-frame area, and drive circuits that drive the gate lines GL in the even-numbered rows are arranged in the other picture-frame area will be described.

Figure 13:
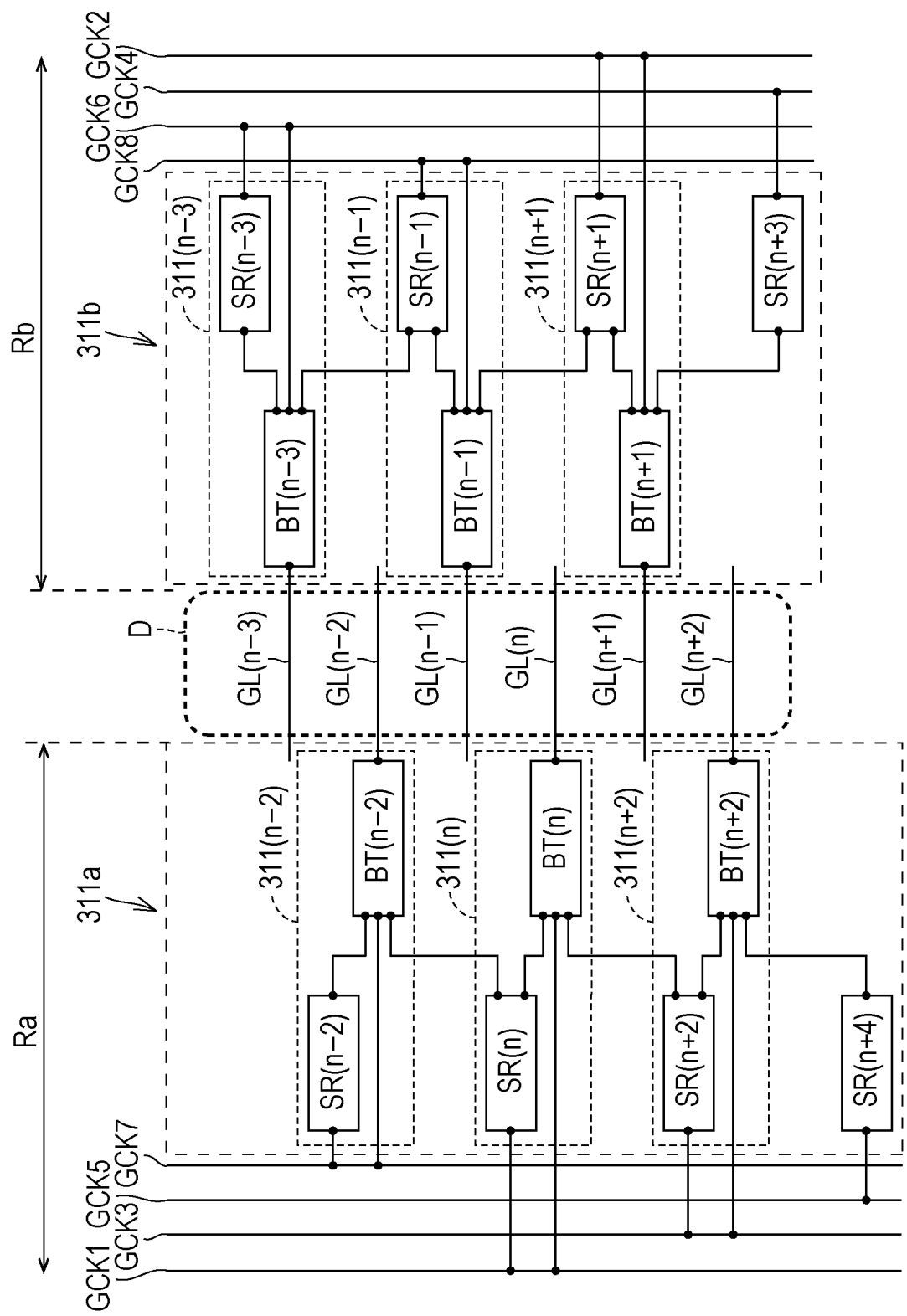
FIG. 13 is a schematic view illustrating an example of arrangement of a gate driver in a sixth embodiment.

FIG. 13 is a schematic view illustrating an example of arrangement of the gate driver in the present embodiment. In FIG. 13, an example of arrangement of the drive circuits 311 of the gate driver 31 in the second embodiment is illustrated.

As illustrated in FIG. 13, a drive circuit group 311a is disposed in the picture-frame area Ra, and a drive circuit group 311b is disposed in the picture-frame area Rb. The drive circuit group 311a includes the drive circuits 311(n−2), 311(n), 311(n+2), . . . that drive the gate lines GL(n−2), GL(n), GL(n+2), . . . . In addition, the drive circuit group 311b includes the drive circuits 311(n−3), 311(n−1), 311(n+1), . . . that drive the gate lines GL(n−3), GL(n−1), GL(n+1), . . . .

While the configuration of each drive circuit 311 is the same as the second embodiment (FIG. 6B), a clock signal that is supplied to the drive circuit 311 is different from that in the second embodiment.

In the present embodiment, as the clock signal, 8-phase clock signals GCK1 to GCK8 having different phases are supplied to the gate driver. In this example, each of the clock signals GCK1 to GCK8 is a signal that alternately has the H level and L level electric potentials for every four horizontal scanning periods repeatedly. That is, one cycle of the H level or L level electric potential in each of the clock signals GCK1 to GCK8 corresponds to eight horizontal scanning periods (8H).

Each drive circuit 311 of the drive circuit group 311a is supplied with any clock signal of the clock signals GCK1, GCK3, GCK5, and GCK7. In addition, each drive circuit 311 of the drive circuit group 311b is supplied with any clock signal of the clock signals GCK2, GCK4, GCK6, and GCK8.

Each of the clock signals GCK1, GCK3, GCK5, and GCK7 has a phase difference of two horizontal scanning periods with its adjacent clock signal. In addition, each of the clock signals GCK2, GCK4, GCK6, and GCK8 has a phase difference of two horizontal scanning periods with its adjacent clock signal. Each drive circuit 311 arranged in the same picture-frame area is supplied with a clock signal of which the phase is shifted by two horizontal scanning periods from those of the drive circuits 311 in the previous stage and the subsequent stage.

In the second embodiment, the gate electrode of TFT_M12 of the drive circuit 311(n−1) in the previous stage is connected to netA(n) of the drive circuit 311(n). In the present embodiment, TFT_M12 of the output buffer unit BT(n−2) of the drive circuit 311(n−2) in the second previous stage is connected to netA(n). In addition, in the present embodiment, TFT_M12 of the output buffer unit BT(n) is connected to the shift register unit SR(n+2) of the drive circuit 311(n+2) in the second subsequent stage, that is, netA(n+2).

Figure 14:
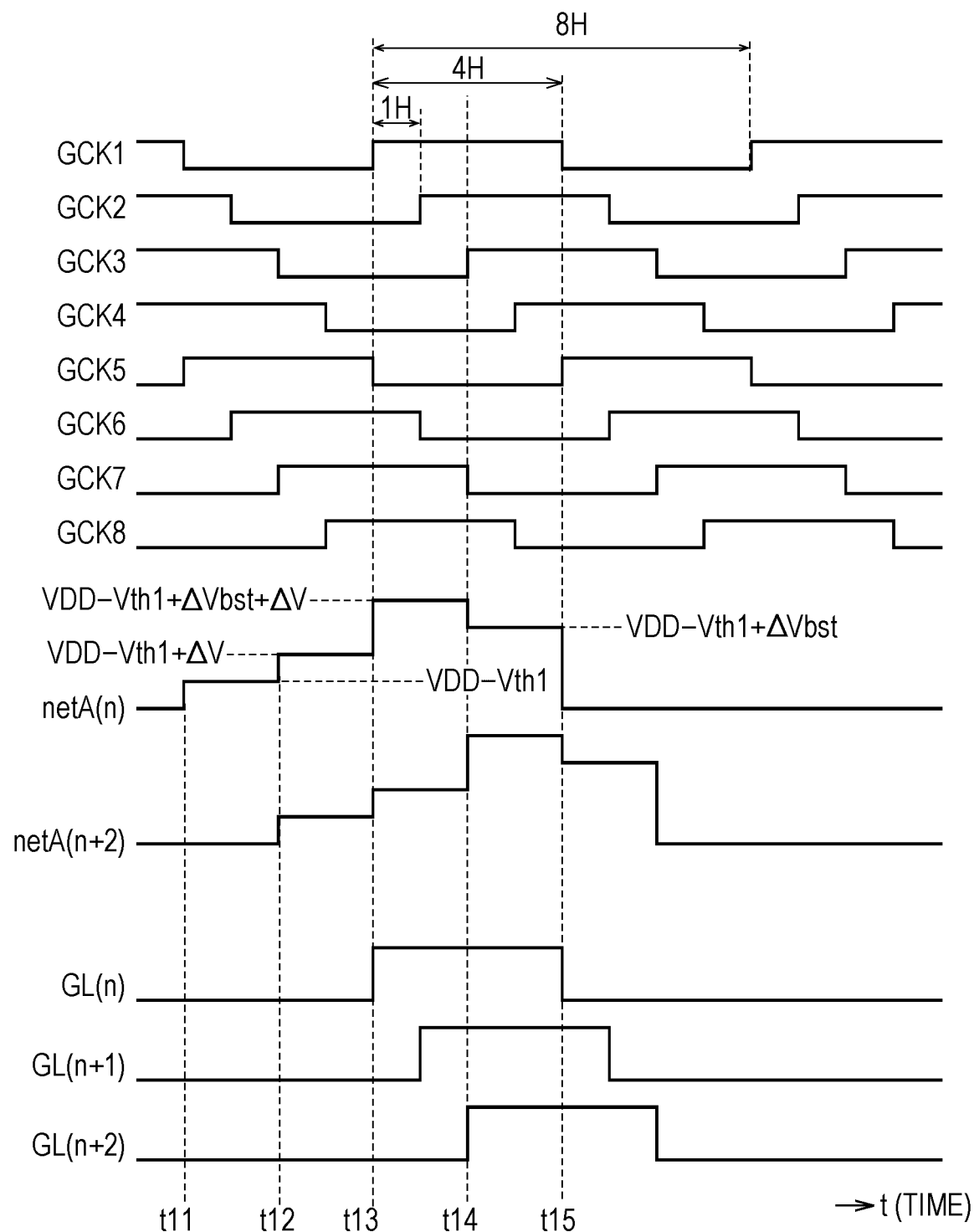
FIG. 14 is a timing chart in a case where a drive circuit in the sixth embodiment drives a gate line.

FIG. 14 is a timing chart in a case where the drive circuit 311(n) in the present embodiment drives the gate line GL(n). The operation of the drive circuit 311(n) is the same as that in the second embodiment and thus, will not be described in detail. Hereinafter, differences from the second embodiment will be described.

As illustrated in FIG. 14, netA(n), netA(n+2), and the gate lines GL(n) to GL(n+2) in the present embodiment have the same waveforms and amplitudes as illustrated in FIG. 7A. However, a period from a change in electric potential to a subsequent change in electric potential is different.

For example, netA(n) is precharged at time t11, and the electric potential of the clock signal GCK7 is set to the H level at time t12. In the present embodiment, a period in which the electric potential of netA(n) is increased to "VDD−Vth1+ΔV" corresponds to two horizontal scanning periods and is longer by one horizontal scanning period than that in the second embodiment. Similarly, a period (t12-t13) in which the electric potential of netA(n) is set to "VDD−Vth1+ΔVbst" corresponds to two horizontal scanning periods.

In addition, in the present embodiment, a period in which the clock signal GCK1 maintains the H level electric potential corresponds to four horizontal scanning periods. Thus, a period t13-t15 in which the gate line GL(n) is set to have the H level electric potential corresponds to four horizontal scanning periods.

In the present embodiment, the number of drive circuits disposed in one picture-frame area (Ra or Rb) can be reduced to ½ of that in the fifth embodiment. Thus, picture-frame narrowing of the picture-frame area (Ra or Rb) can be achieved, compared to the fifth embodiment. In the present embodiment, while an example in which the 8-phase clock signals are used is described, the clock signals are not limited thereto, provided that the clock signals have five phases or more.

Seventh Embodiment

In the sixth embodiment, an example in which one drive circuit is arranged in any one of the picture-frame areas at both ends of the gate lines GL is described. In the present embodiment, an example in which a part of the output buffer unit BT of one drive circuit is arranged in one picture-frame area, and the other part is arranged in the other picture-frame area will be described.

Figure 15:
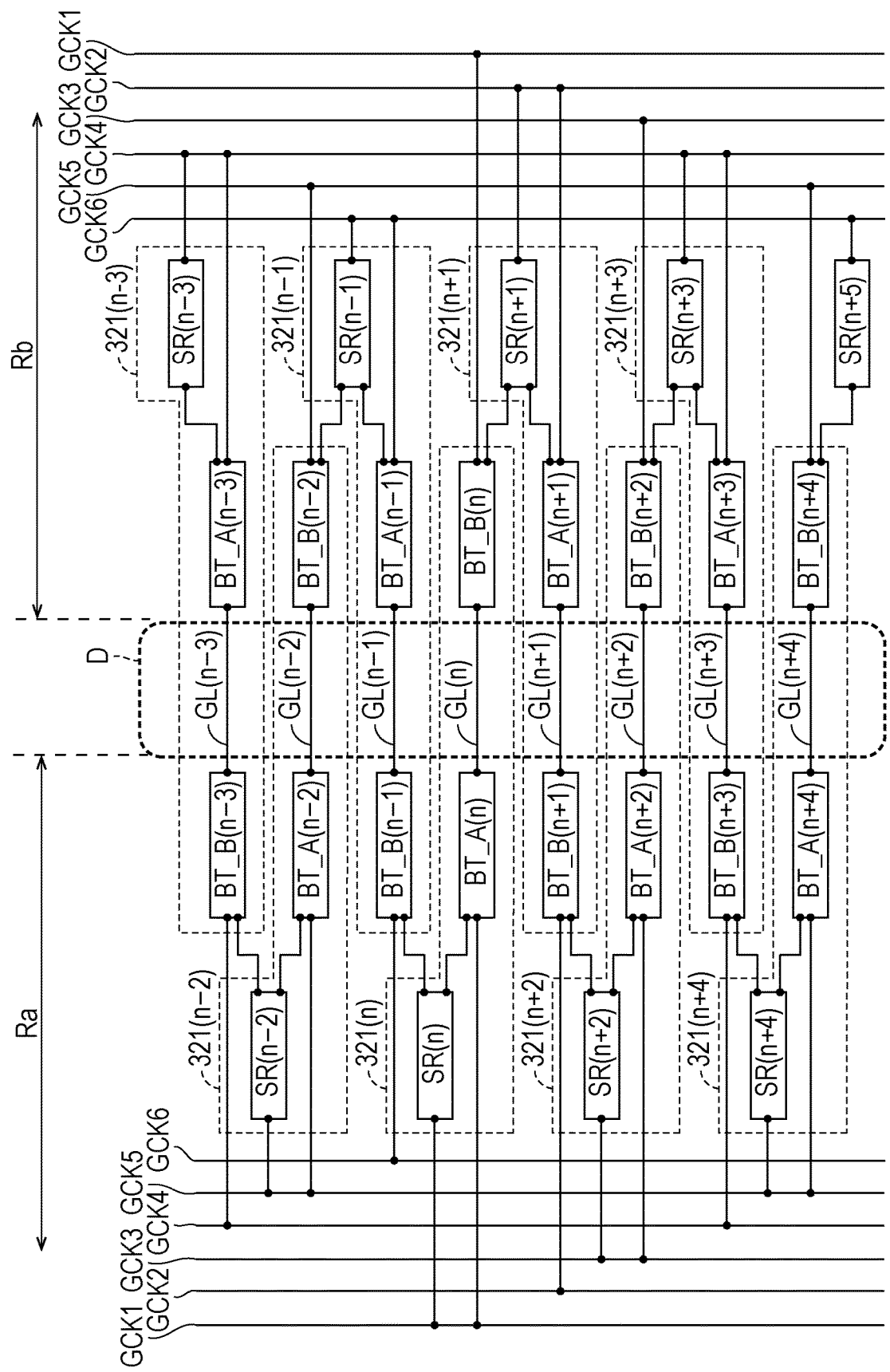
FIG. 15 is a schematic view illustrating an example of arrangement of a drive circuit in a seventh embodiment.

FIG. 15 is a schematic view illustrating an example of arrangement of the drive circuits 321 in the present embodiment. In this example, an example of arrangement of the drive circuits 321(n−3) to 321(n+4) that drive the gate lines GL(n−3) to GL(n+4) is illustrated. Hereinafter, each drive circuit will be referred to as the drive circuit 321 when not distinguished from each other.

As illustrated in FIG. 15, for example, the drive circuit 321(n) includes one shift register unit SR and two output buffer units BT_A(n) and BT_B(n).

Figure 16:
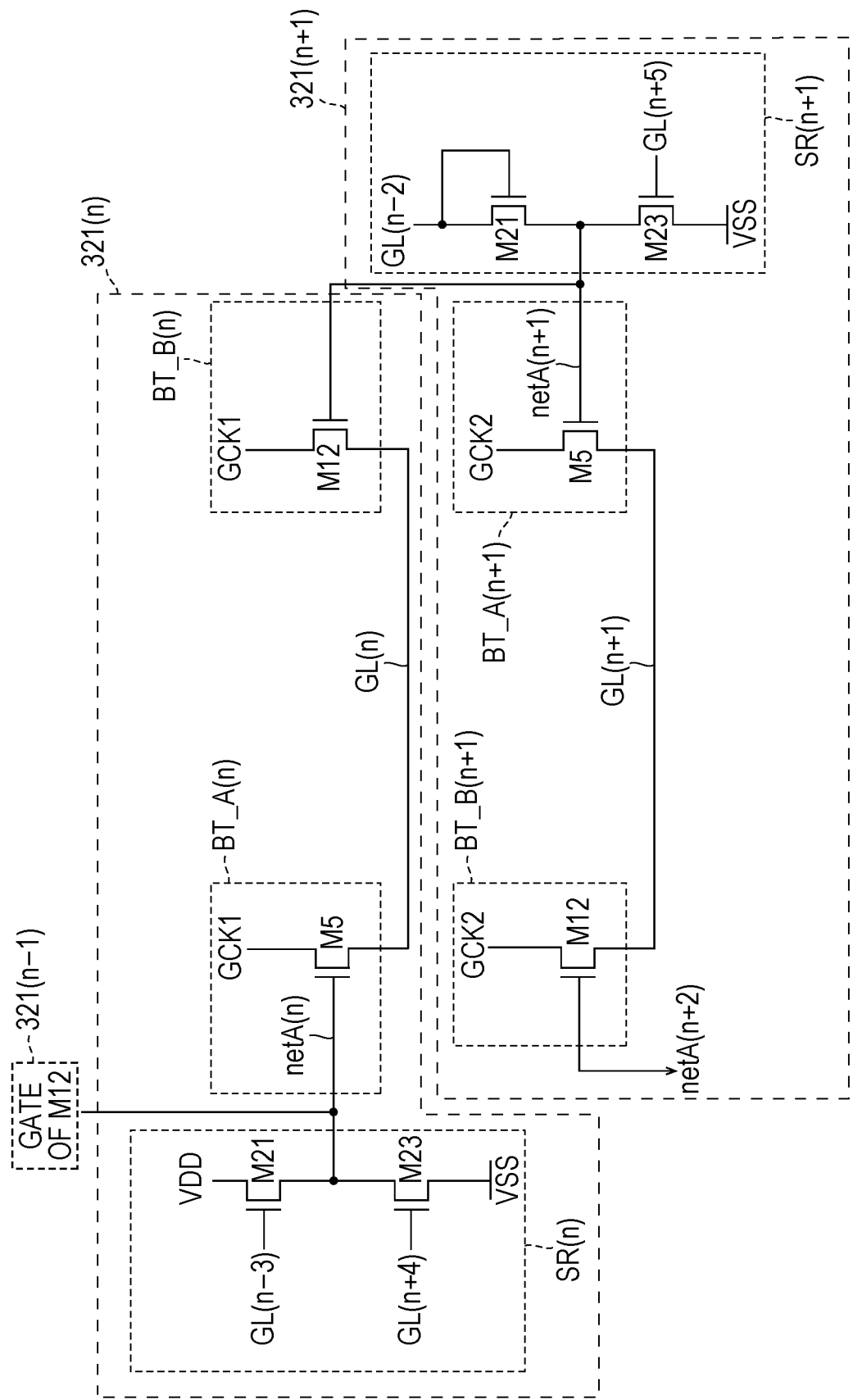
FIG. 16 is an equivalent circuit view illustrating a schematic configuration of the drive circuit illustrated in FIG. 15.

FIG. 16 is an equivalent circuit view illustrating a configuration example of the shift register unit SR(n) and the output buffer units BT_A(n) and BT_B(n) in the drive circuit 321(n). In FIG. 16, the same configurations as the second embodiment are designated by the same reference signs as the second embodiment. While only particular configurations in each drive circuit 321 are illustrated for convenience, elements other than the shift register unit SR(n) and the output buffer unit BT(n) in the second embodiment are disposed in the drive circuit 321.

As illustrated in FIG. 16, the shift register unit SR(n) in the present embodiment includes TFT_M21 and TFT_M23.

TFT_M21 is configured by connecting its gate electrode to the gate line GL(n−3), supplying the power supply voltage VDD to its drain electrode, and connecting netA(n) to its source electrode.

TFT_M23 is configured by connecting its gate electrode to the gate line GL(n+4), connecting its drain electrode to netA(n), and supplying the power supply voltage VSS to its source electrode.

While the point to which the gate electrode of TFT_M23 is connected is different from that of TFT_M3 of the second embodiment, TFT_M23 has the same function as TFT_M3. That is, TFT_M23 has a function of discharging netA(n) to the L level electric potential.

The output buffer unit BT_A(n) includes the same TFT_M5 as the second embodiment, and the output buffer unit BT_B(n) includes the same TFT_M12 as the second embodiment.

In addition, in this example, each drive circuit 321 is supplied with any clock signal of 6-phase clock signals GCK1 to GCK6 having different phases.

Figure 17:
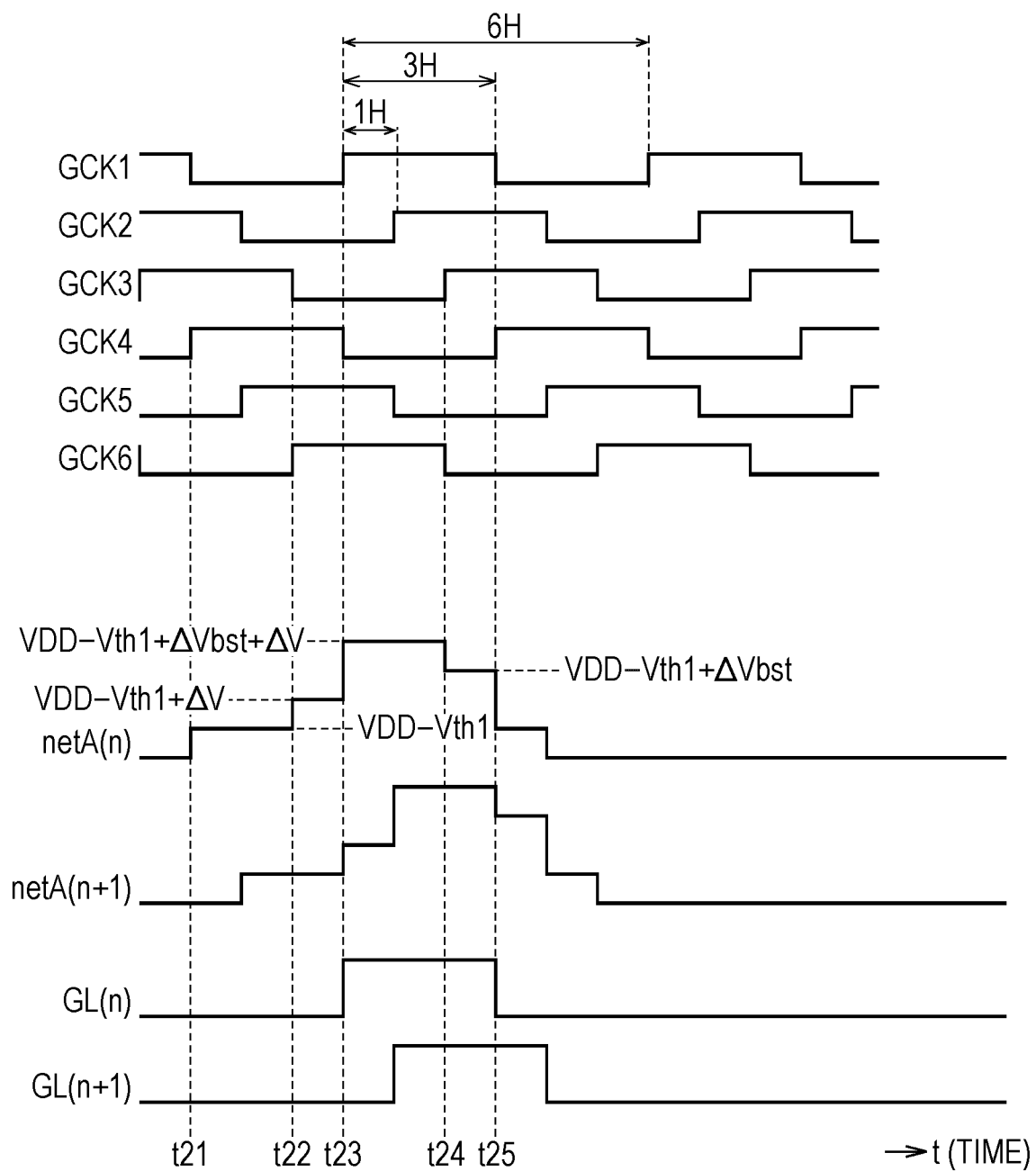
FIG. 17 is a timing chart in a case where the drive circuit illustrated in FIG. 16 drives a gate line.

FIG. 17 is a timing chart in a case where the drive circuit 321(n) drives the gate line GL(n). The operation of the drive circuit 321(n) is the same as that in the second embodiment and thus, will not be described in detail. Hereinafter, differences from the second embodiment will be described.

In the present embodiment, any of the 6-phase clock signals GCK1 to GCK6 having different phases is supplied to each drive circuit 321. Each of the clock signals GCK1 to GCK6 alternately has the H level and L level electric potentials for every three horizontal scanning periods (3H) repeatedly. That is, one cycle of the H level or L level electric potential in each of the clock signals GCK1 to GCK6 corresponds to six horizontal scanning periods (6H). The minimum phase difference among the clock signals GCK1 to GCK6 is one horizontal scanning period.

While the amplitudes of netA and each gate line GL illustrated in FIG. 17 are the same as those in the second embodiment, a period from a change in electric potential to a subsequent change in electric potential is different from that in the second embodiment.

For example, netA(n) is precharged by TFT_M21 of the drive circuit 321(n) at time t21, and the electric potential of the clock signal GCK6 is set to the H level at time t22. The clock signal GCK6 is supplied to TFT_M12 of the drive circuit 321(n−1) connected to netA(n).

Thus, in a case where the clock signal GCK6 transitions to the H level electric potential, the electric potential of netA(n) is set to "VDD−Vth1+ΔV" due to parasitic capacitance between TFT_M12 of the drive circuit 321(n−1) and netA(n). In the present embodiment, a period in which the electric potential of netA(n) is increased to "VDD−Vth1+ΔV" after precharging corresponds to two horizontal scanning periods.

Next, at time t23 after an elapse of one horizontal scanning period from time t22, the clock signal GCK1 transitions to the H level electric potential. At this point, since netA(n) is precharged, TFT_M5 is set to be in the ON state. Accordingly, the H level electric potential starts being charged to the gate line GL(n) through TFT_M5, and the electric potential of netA(n) is set to "VDD−Vth1+ΔV+ΔVbst". Thus, in the present embodiment, a period in which the electric potential of netA(n) is increased to "VDD−Vth1+ΔV+ΔVbst" from "VDD−Vth1+ΔV" corresponds to one horizontal scanning period.

At time t24 after an elapse of two horizontal scanning periods from time t23, the clock signal GCK6 transitions to the L level electric potential. Accordingly, the electric potential of netA(n) is decreased to "VDD−Vth1+ΔVbst". Thus, in the present embodiment, a period in which the electric potential of netA(n) is decreased to "VDD−Vth1+ΔVbst" from "VDD−Vth1+ΔV+ΔVbst" corresponds to two horizontal scanning periods.

At time t25 after an elapse of one horizontal scanning period from time t24, the clock signal GCK1 transitions to the L level electric potential. Accordingly, the electric potential of netA(n) is decreased to "VDD−Vth1". At this point, the electric potential of netA(n+1) is "VDD−Vth1+ΔV+ΔVbst". Thus, the electric potential of the gate line GL(n) transitions to the L level through TFT_M12. Thus, a period in which the electric potential of netA(n) is decreased to "VDD−Vth1" from "VDD−Vth1+ΔVbst" corresponds to one horizontal scanning period.

In the present embodiment, a period in which each clock signal is set to have the H level electric potential corresponds to three horizontal scanning periods. Thus, a period in which the gate line GL(n) is set to have the H level electric potential corresponds to three horizontal scanning periods.

In the present embodiment, since the drive circuits 321 corresponding to each gate line GL are separately arranged in two picture-frame areas (Ra, Rb), picture-frame narrowing can be achieved, compared to the case of arranging all drive circuits 321 in one picture-frame area. In addition, in the same manner as the second embodiment, in a case where each gate line GL is caused to transition to the L level electric potential, an ON voltage that is higher than that in the related art is applied to TFT_M12, and the electric potential of the gate line GL can be promptly decreased to the L level. In addition, in the present embodiment, since each gate line GL can be charged and discharged from both ends of the gate line GL, the gate line GL can be switched to be in the unselected state more promptly than that in the sixth embodiment. In the present embodiment, while an example in which the 6-phase clock signals are used is described, the clock signals are not limited thereto, provided that the clock signals have four phases or more.

Eighth Embodiment

In the present embodiment, a configuration for decreasing the electric potential of each gate line GL to the L level more promptly than the seventh embodiment will be described.

Figure 18:
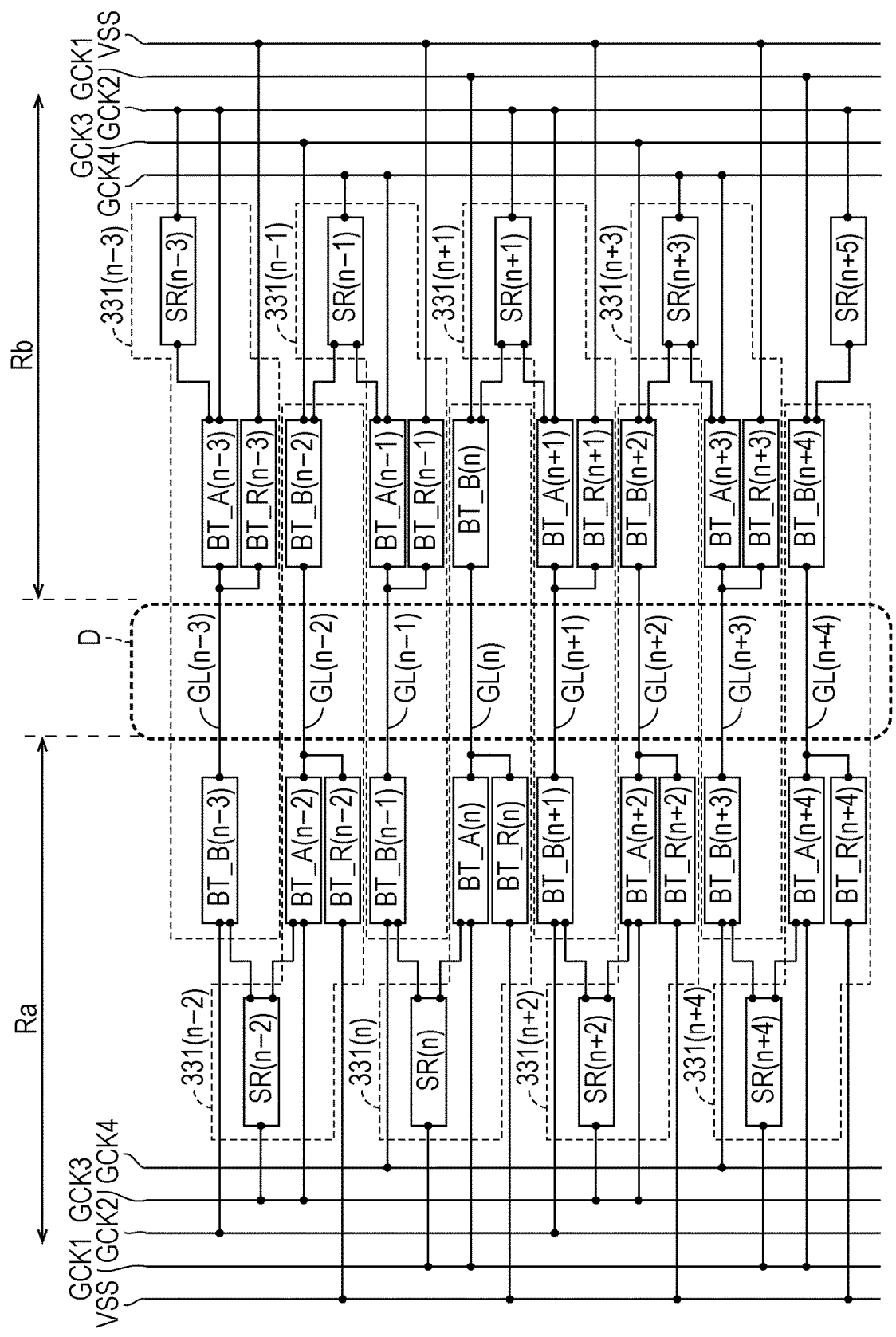
FIG. 18 is a schematic view illustrating an example of arrangement of a drive circuit in an eighth embodiment.

FIG. 18 is a schematic view illustrating an example of arrangement of the drive circuits 331 in the present embodiment. In FIG. 18, the same configurations as the seventh embodiment are designated by the same reference signs as the seventh embodiment. In FIG. 18, an example of arrangement of the drive circuits 331(n−3) to 331(n+4) that drive the gate lines GL(n−3) to GL(n+4) is illustrated. Hereinafter, each drive circuit will be referred to as the drive circuit 331 when not distinguished from each other.

As illustrated in FIG. 18, each drive circuit 331 includes an output buffer unit BT_R in addition to the output buffer units BT_A and BT_B. The output buffer unit BT_R is arranged in the same picture-frame area as the output buffer unit BT_A.

Each drive circuit 331 is supplied with any clock signal of 4-phase clock signals GCK1 to GCK4 in the same manner as the second embodiment. Hereinafter, a specific configuration of each drive circuit 331 will be described.

Figure 19:
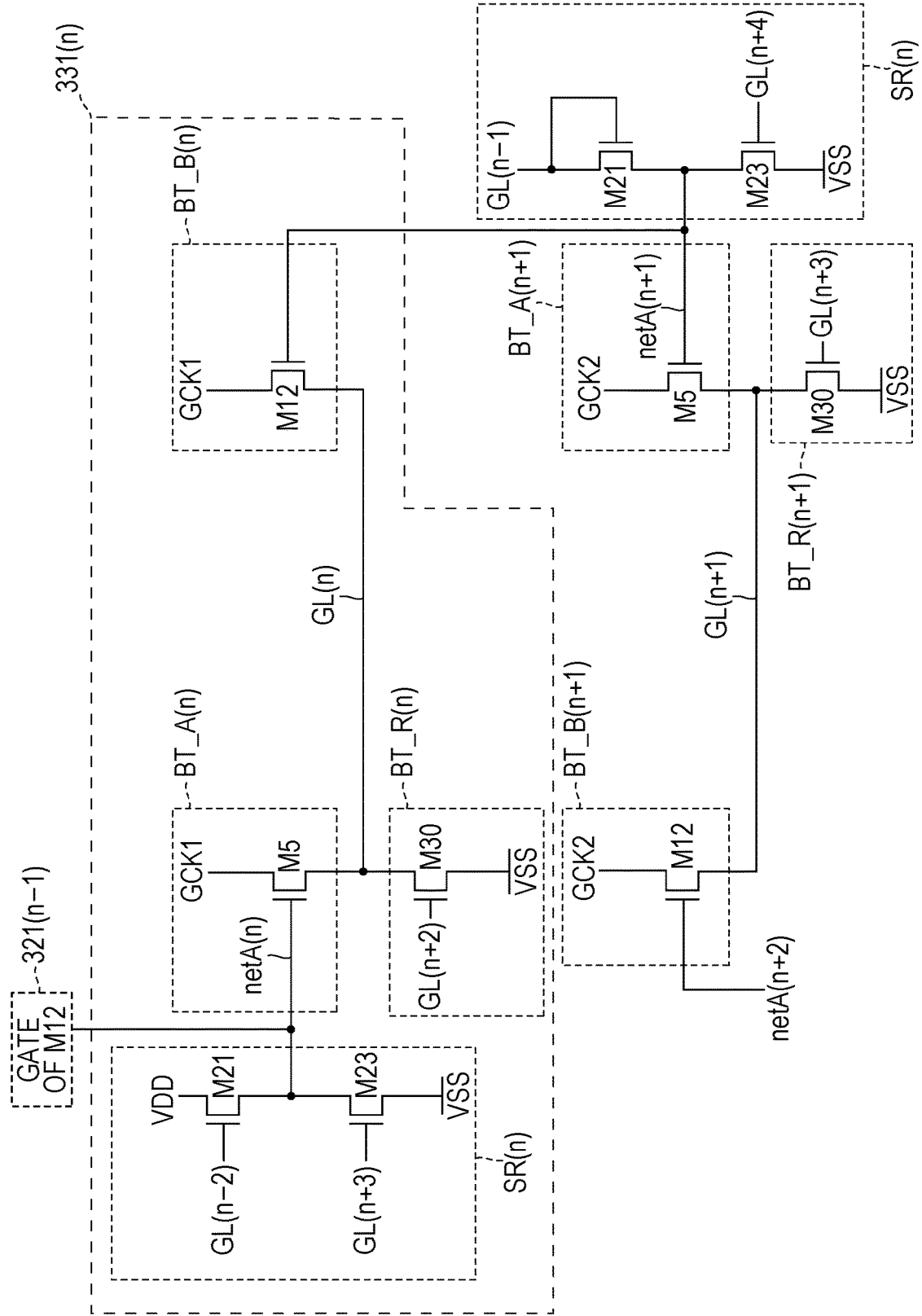
FIG. 19 is an equivalent circuit view illustrating a schematic configuration of the drive circuit illustrated in FIG. 18.

FIG. 19 is an equivalent circuit view illustrating a configuration example of the shift register unit SR and the output buffer units BT_A, BT_B, and BT_R in each drive circuit 331. In FIG. 19, the same configurations as the seventh embodiment are designated by the same reference signs as the seventh embodiment.

While only particular configurations in each drive circuit 331 are illustrated for convenience, elements other than the shift register unit SR and the output buffer unit BT in each drive circuit 311 of the second embodiment are disposed in each drive circuit 331. Hereinafter, configurations that are different from the seventh embodiment will be described with the drive circuit 331(n) as an example.

As illustrated in FIG. 19, the output buffer unit BT_R(n) includes a TFT denoted by M30 (hereinafter, TFT_M30). TFT_M30 is configured by connecting its gate electrode to the gate line GL(n+2), connecting its drain electrode to the gate line GL(n), and supplying the power supply voltage VSS to its source electrode.

In addition, in the present embodiment, in the shift register unit SR(n), the gate electrode of TFT_M21 is connected to the gate line GL(n−2), and the gate electrode of TFT_M23 is connected to the gate line GL(n+3).

Figure 20:
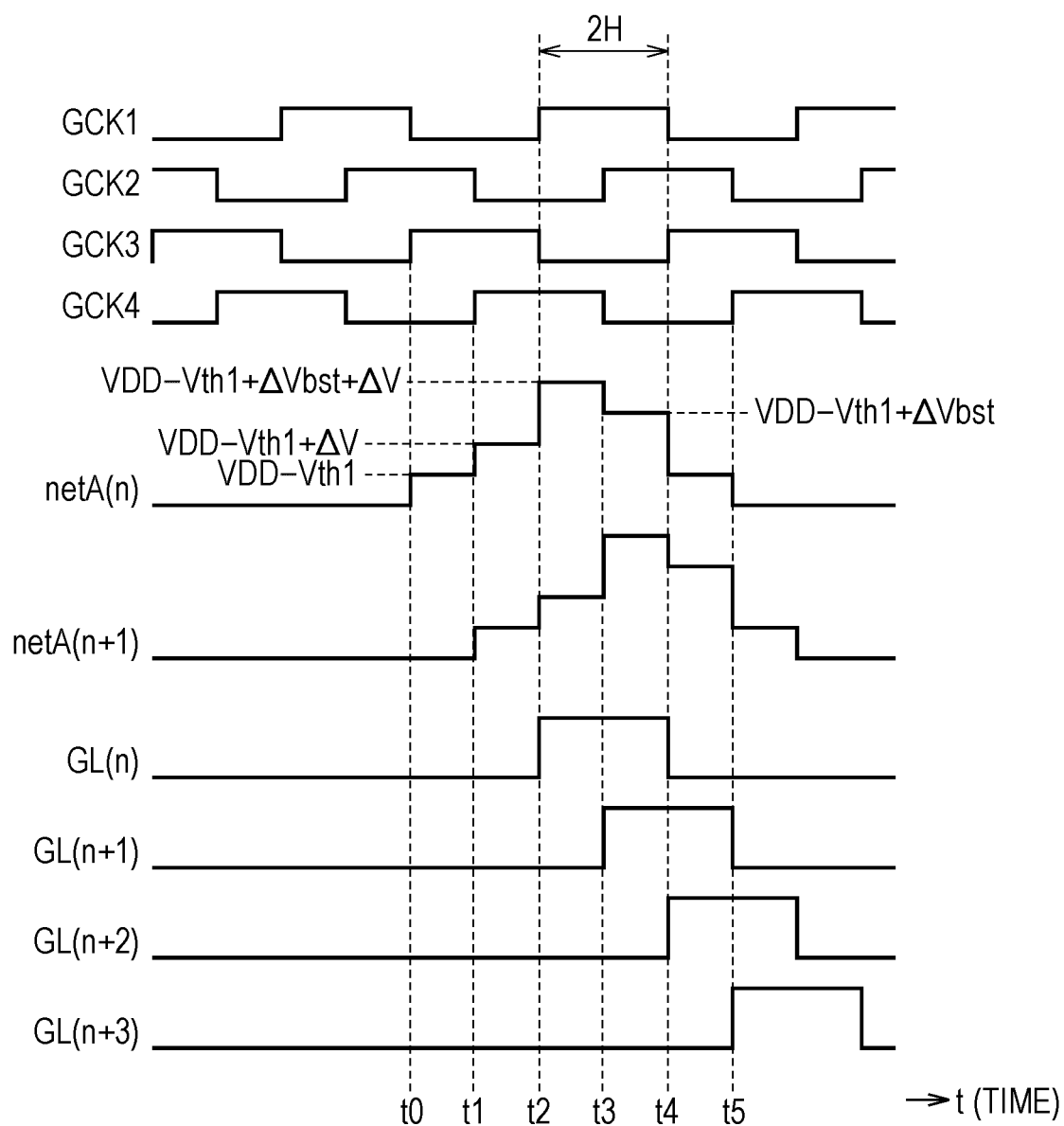
FIG. 20 is a timing chart in a case where the drive circuit illustrated in FIG. 19 drives a gate line.

FIG. 20 is a timing chart in a case where the drive circuit 331(n) in the present embodiment drives the gate line GL(n). The operation of the drive circuit 331(n) is the same as that in the second embodiment and thus, will not be described in detail. Hereinafter, differences from the second embodiment (FIG. 7A) will be described.

In the present embodiment, a timing at which the electric potential of netA(n) transitions to the L level from "VDD−Vth1+ΔVbst" is shifted by one horizontal scanning period to be later than that in the second embodiment.

As illustrated in FIG. 20, in the present embodiment, after the electric potential of netA(n) transitions to "VDD−Vth1+ΔVbst" at time t3, the gate line GL(n+2) starts being charged to the H level electric potential at time t4. Accordingly, TFT_M30 is set to be in the ON state, and the gate line GL(n) is discharged to the L level electric potential through TFT_M30.

In a case where the gate line GL(n) starts being discharged to the L level electric potential, the electric potential of netA(n) is decreased to "VDD−Vth1" through the capacitor Cbst (not illustrated). At this point, TFT_M5 is in the ON state. Thus, the gate line GL(n) is discharged to the L level electric potential through TFT_M30 and TFT_M5.

At time t5, in a case where the gate line GL(n+3) starts being charged to the H level electric potential, TFT)M23 is set to be in the ON state, and the electric potential of netA(n) is decreased to the L level.

In the present embodiment, by further disposing TFT_M30, the amount of time for discharging the gate line GL(n) to the L level electric potential is further reduced. In addition, the amount of time for the electric potential of netA(n) to transition to the L level is larger than that in the second embodiment. That is, a period in which netA(n) is set to have a voltage at the time of precharging or higher is longer by one horizontal scanning period than that in the second embodiment. Thus, the amount of time in which the ON voltage is applied to TFT_M5 is increased, and the capability of discharging the gate line GL(n) by TFT_M5 can be increased. In the present embodiment, while an example in which the 4-phase clock signals are used is described, the clock signals are not limited thereto, provided that the clock signals have four phases or more.

Ninth Embodiment

In the present embodiment, an example in which the drive circuit of the seventh embodiment is applied in a display device that alternately performs touch position detection and image display in one vertical scanning period will be described.

Figure 21:
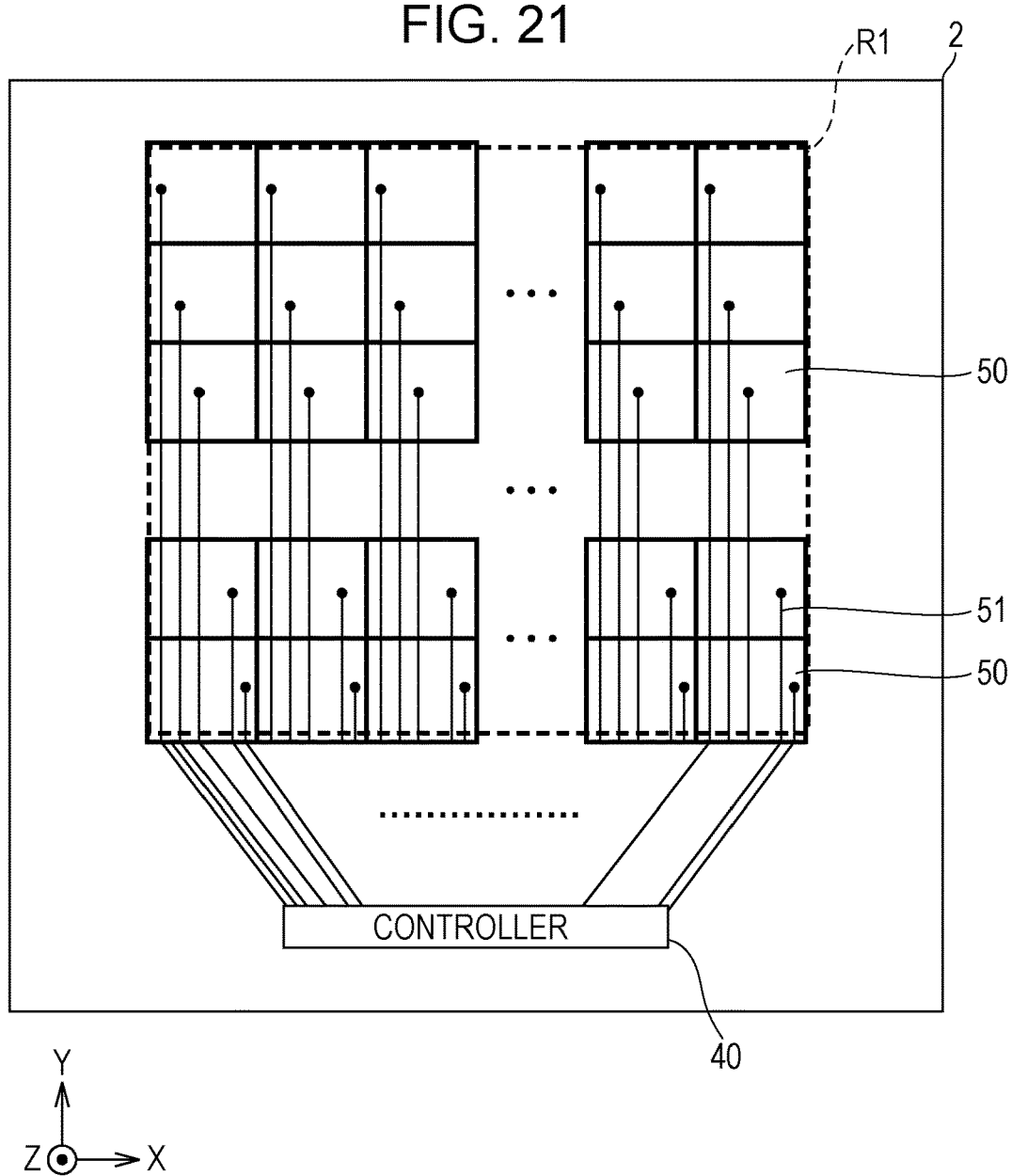
FIG. 21 is a schematic view illustrating an example of arrangement of a counter electrode in a ninth embodiment.

FIG. 21 is a schematic view illustrating one example of arrangement of the counter electrodes 50 formed in the active matrix substrate 2. As illustrated in FIG. 21, a plurality of the counter electrodes 50 are arranged in a matrix form on the active matrix substrate 2, and each has a rectangular shape. Each counter electrode 50 is disposed in an upper layer than each pixel electrode 12 on the surface of the active matrix substrate 2 on the liquid crystal layer 4 (refer to FIG. 1) side. Each counter electrode 50 has an approximately square shape of which the length of each edge is a few mm, and is larger than the pixel. While illustration is not provided in FIG. 21, a slit (having a width of, for example, a few μm) for generating a transverse electric field between each counter electrode 50 and each pixel electrode 12 is formed in each counter electrode 50.

The active matrix substrate 2 includes the controller 40 on a side of the picture-frame area in which the source driver 20 illustrated in FIG. 2A is disposed. The controller 40 controls image display for displaying an image and performs touch position detection position control for detecting a touch position.

A signal line 51 that extends in a Y axis direction connects the controller 40 to each counter electrode 50. That is, the same number of signal lines 51 as the number of counter electrodes 50 are formed on the active matrix substrate 2.

Each counter electrode 50 with each pixel electrode 12 as a pair is used in the case of image display control and is also used in the case of touch position detection control.

Figure 22:
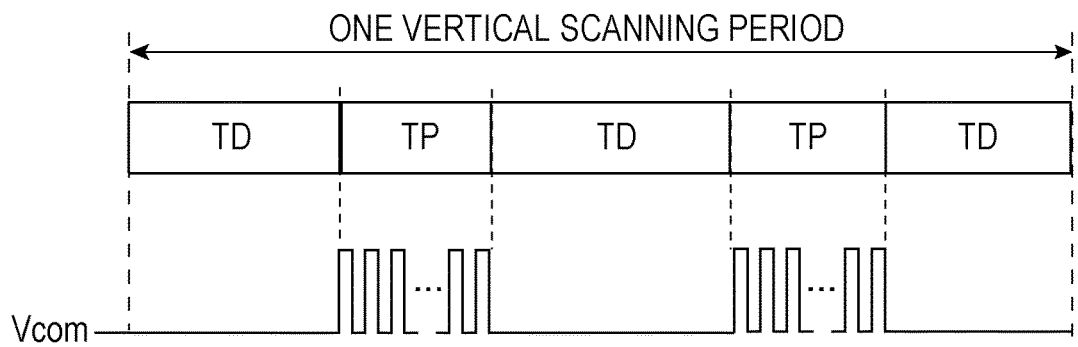
FIG. 22 is a schematic view for describing an image display period and a touch position detection period in the ninth embodiment.

In the present embodiment, as illustrated in FIG. 22, an image display period TD and a touch position detection period TP alternately occur a plurality of times in one vertical scanning period.

In the image display period TD, the controller 40 supplies a constant direct current signal to the signal lines 51 and causes each counter electrode 50 to function as a common electrode. In the touch position detection period TP, the controller 40 supplies an alternating current signal having a constant amplitude to the signal lines 51 as a touch drive signal for detecting the touch position.

In a case where a finger or the like of a person comes into contact with a display screen, capacitance is formed between the finger or the like of the person and each counter electrode 50. In the case of touch position detection control, each counter electrode 50 receives the touch drive signal supplied through each signal line 51 and outputs a change in capacitance at a position in the counter electrode 50 to the controller 40 through the signal line 51.

The gate driver 30 sequentially scans the gate lines GL in the image display period TD, and stops scanning the gate lines GL in the touch position detection period TP. That is, the image display period TD is a scanning period for the gate lines GL, and the touch position detection period TP is a non-scanning period for the gate lines GL.

Figure 23:
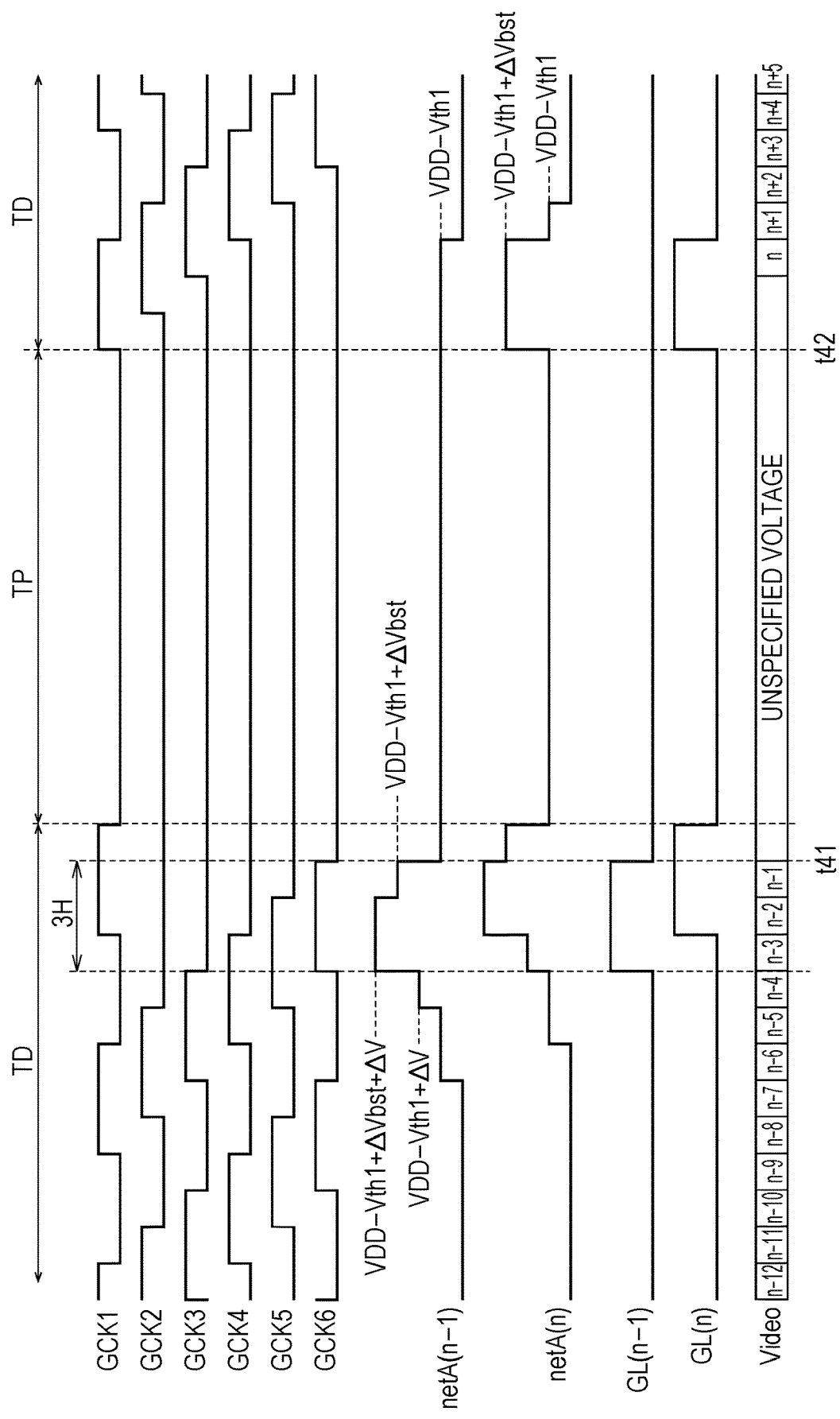
FIG. 23 is a timing chart in a case where a gate line is driven in the ninth embodiment.

FIG. 23 is a timing chart in a case where the gate lines GL are driven using the drive circuit 321 of the seventh embodiment.

In the example in FIG. 23, before the touch position detection period TP is started, the gate lines GL up to the gate line GL(n) are driven, and display data (Video(n−1)) that is to be written into the pixels in which the gate line GL(n−1) is disposed is input.

In the present embodiment, the clock signal GCK1 is supplied to the drive circuit 321(n) until the electric potential of the gate line GL(n−1) transitions to the L level. Then, the touch position detection period TP is started. During the touch position detection period TP, all clock signals are controlled to have the L level electric potential.

By input of the clock signal GCK1, netA(n) maintains an electric potential of "VDD−Vth1+ΔVbst+ΔV" through TFT_M5 of the drive circuit 321(n) until the start of the touch position detection period TP. Thus, the electric potential of the gate line GL(n−1) transitions to the L level electric potential through TFT_M12 of the drive circuit 321(n−1) before the start of the touch position detection period TP.

An unspecified voltage from the source driver 20 (refer to FIG. 2A) is applied to each source line SL from time t41 at which the gate line GL(n−1) transitions to the L level electric potential, until the image display period TD is resumed. At this point, since all gate lines GL have the L level electric potential, the display data is not written into each pixel.

During the touch position detection period TP, since the clock signal GCK1 is at the L level, the electric potential of netA(n) is set to "VDD−Vth1".

When the image display period TF is resumed, the input of the clock signals GCK1 to GCK6 is resumed such that the clock signal GCK1 is set to have the H level electric potential. Accordingly, the electric potential of netA(n) is increased to "VDD−Vth1+ΔVbst" again through TFT_M5 of the drive circuit 321(n), and the gate line GL(n) is charged to the H level electric potential.

After an elapse of two horizontal scanning periods from when the gate line GL(n) starts being charged to the H level electric potential, a voltage signal of the display data (Video (n)) to be written into the pixels in which the gate line GL(n) is disposed is input into each source line SL. Accordingly, the display data (Video(n)) is written into the pixels in which the gate line GL(n) is disposed.

Figure 24:
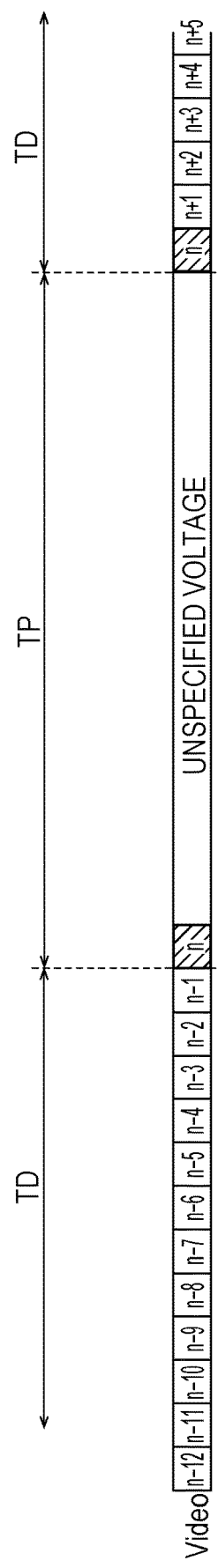
FIG. 24 is a view for describing an example of an input different from an input of a data signal in FIG. 23.

In the ninth embodiment, when the gate line GL(n) is in the selected state before the start of the touch position detection period TP, the voltage signal of the display data (Video(n)) for the pixels in which the gate line GL(n) is disposed may be input into the source lines SL as illustrated in FIG. 24. By such a configuration, the display data can be written into the pixels in which the gate line GL(n) is disposed, before the start of the touch position detection period TP. However, by such a configuration, the amount of time for switching the gate line GL(n) to be in the unselected state is increased, and the display quality of the pixels in which the gate line GL(n) is disposed may be decreased.

In addition, in such a configuration, in a case where the subsequent image display period TD is resumed, the clock signal GCK1 having the H level electric potential may be supplied, and the voltage signal of the display data (Video (n)) may be input into the source lines SL in the same manner as the ninth embodiment. Accordingly, when the image display period TD is resumed, the display data (Video(n)) is written again into the pixels in which the gate line GL(n) is disposed.

In addition, in this case, in the same manner as the ninth embodiment, the input of the clock signals GCK1 to GCK6 may be resumed such that the electric potential of the clock signal GCK 1 is set to the H level when the image display period TD is resumed. Accordingly, the electric potential of netA(n) can be changed in the same manner as netA in another row, and the display data can be appropriately written and retained.

While one example of the display device according to the present disclosure is described thus far, the display device according to the present disclosure is not limited to the configurations of the above embodiments, and various modifications can be made. Hereinafter, modification examples of the display device will be described.

(1) In the above embodiments, while an example in which the TFT used in the drive circuit is configured with an n-channel TFT is described, the TFT may be configured with a p-channel TFT, or an n-channel TFT and a p-channel TFT may coexist. In the case of the p-channel TFT, a current flows between its drain and its source more easily as the voltage applied to its gate electrode is decreased. Thus, in a case where the p-channel TFT is used, the electric potential relationship in each embodiment is opposite to the electric potential relationship in the case of the n-channel TFT.

(2) In the ninth embodiment, while the electric potential of each clock signal is controlled to be at the L level during the touch position detection period, the supply of the clock signal to the drive circuit may be stopped during only the touch position detection period.

(3) In the above embodiments, while amorphous silicon (a-Si) may be used in the TFT 11 for pixels and a semiconductor layer of the TFT used in the drive circuit, it is desirable to use an oxide semiconductor.

The oxide semiconductor is, for example, an indium (In)-gallium (Ga)-zinc (Zn)-oxygen (O) based ternary oxide. While the proportion (composition ratio) of In, Ga, and Zn are not particularly limited, the proportion may be, for example, In:Ga:Zn=2:2:1, In:Ga:Zn=1:1:1, or In:Ga:Zn=1: 1:2. In addition, for example, In, Ga, and Zn may be included at a proportion of 1:1:1. A TFT that includes an In—Ga—Zn—O based semiconductor layer has higher mobility (over 20 times) than the TFT in which a-Si is used, and a lower leakage current (less than 1/100) than the TFT in which a-Si is used. Thus, particularly, such a TFT is suitably used as the TFT of the drive circuit. Thus, in a case where the TFT including the In—Ga—Zn—O semiconductor layer is used, a leakage current in the drive circuit is suppressed, and the electric power consumption of the display device can be reduced to a great extent.

In addition, the In—Ga—Zn—O based semiconductor may be amorphous or may include a crystalline part and have crystallinity. The crystalline In—Ga—Zn—O based semiconductor is desirably a crystalline In—Ga—Zn—O based semiconductor of which the c axis is oriented approximately perpendicular to the surface of the layer. The crystal structure of such an In—Ga—Zn—O based semiconductor is disclosed in, for example, Japanese Unexamined Patent Application Publication No. 2012-134475. The entire content of the disclosure of Japanese Unexamined Patent Application Publication No. 2012-134475 is incorporated in the present specification by reference.

The oxide semiconductor layer may include another oxide semiconductor instead of the In—Ga—Zn—O based semiconductor. For example, a Zn—O based semiconductor (ZnO), an In—Zn—O based semiconductor (IZO (registered trademark)), a Zn—Ti—O based semiconductor (ZTO), a Cd—Ge—O based semiconductor, a Cd—Pb—O based semiconductor, a cadmium oxide (CdO), a Mg—Zn—O based semiconductor, an In—Sn—Zn—O based semiconductor (for example, $In_2O_3$—$SnO_2$—ZnO), or an In—Ga—Sn—O based semiconductor may be included.

(4) In the above embodiments, while an example in which any of the 4-phase, 6-phase, or 8-phase clock signals are supplied to the drive circuit is described, the drive circuit may be supplied with M-phase (M: a natural number greater than or equal to three) clock signals. For example, in the first embodiment, in a case where 3-phase clock signals are supplied, the clock signals alternately have the H level and L level electric potentials repeatedly such that the clock signals have the H level electric potential for two horizontal scanning periods and the L level electric potential for one horizontal scanning period. One cycle of the H level or L level electric potential in these clock signals corresponds to three horizontal scanning periods.

Figure 25:
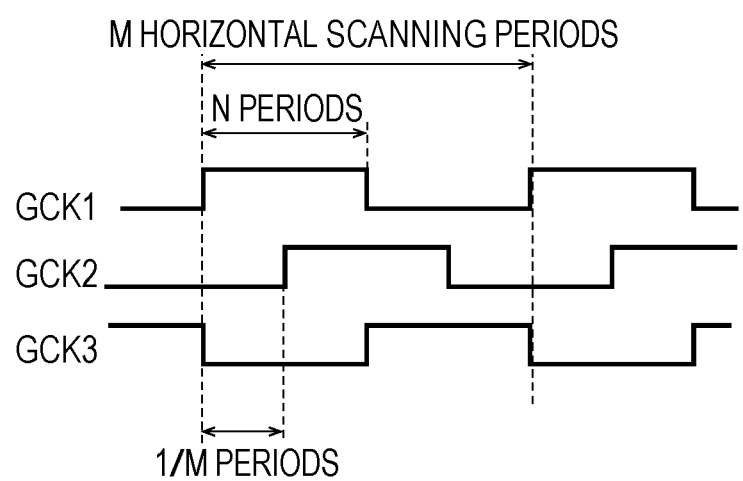
FIG. 25 is a view for describing a change in electric potential and a phase difference of a clock signal in an embodiment.

The M-phase clock signals common in each embodiment, the clock signals supplied to the drive circuit, and a change in the electric potential of the internal wiring of the drive circuit will be summarized. As illustrated in FIG. 25, the clock signals (GCK1 to GCK3) are set to have the H level or L level electric potential for every one cycle (M horizontal scanning periods). During M horizontal scanning periods, a period in which the clock signals are set to have the H level or L level electric potential corresponds to N periods (1/M<N<M), and the minimum phase difference of the M-phase clock signals is 1/M periods. N periods correspond to a period in which the H level or L level electric potential continues.

The drive circuit includes netA (internal wiring) and the output buffer unit BT (output circuit unit). The output buffer unit BT includes a switching element (TFT_M12) that is configured by connecting its source electrode to one gate line GL, supplying one clock signal to its drain electrode, and connecting its gate electrode to the internal wiring of the drive circuit in another stage.

The internal wiring is charged to an electric potential between the L level electric potential and an electric potential at the H level or higher depending on the supplied clock signal. The drive circuit in the other stage is supplied with the one clock signal and another clock signal of which the phase difference with the M-phase clock signals is greater than or equal to the minimum phase difference (1/M) and less than N periods. When the one gate line GL is set to be in the selected state or the unselected state, the electric potential of the internal wiring of the drive circuit in the other stage is an electric potential at the H level or higher.

(5) In the above embodiments, while a display device in which liquid crystal is used is described as an example, the drive circuit of each embodiment may be applied to a display device in which organic electroluminescence (EL) is used.

The present disclosure contains subject matter related to that disclosed in Japanese Priority Patent Application JP 2017-198617 filed in the Japan Patent Office on Oct. 12, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a display panel that includes a plurality of gate lines; and
a drive unit that includes a plurality of drive circuits which are respectively disposed in correspondence with the plurality of gate lines and sequentially scan the plurality of gate lines using a supplied control signal,
wherein the control signal includes M-phase (M is a natural number greater than or equal to three) drive signals that have different phases and are set to have a first electric potential or a second electric potential lower than the first electric potential at a predetermined cycle,
each of the plurality of drive circuits includes
internal wiring of which an electric potential changes depending on one drive signal, and
an output circuit unit that switches a corresponding gate line to be in a selected state or an unselected state, and
in one drive circuit,
the electric potential of the internal wiring changes with the first electric potential or the second electric potential as a reference,
the output circuit unit includes at least one first output switching element,
the first output switching element includes a gate electrode that is connected to the internal wiring of a first drive circuit different from the drive circuit among the plurality of drive circuits, a drain electrode that is supplied with the one drive signal, and a source electrode that is connected to the corresponding gate line, and
a difference in an electric potential between the electric potential of the internal wiring of the first drive circuit in a case where the corresponding gate line transitions to the unselected state or the selected state and the electric potential as the reference in the internal wiring is greater than or equal to a difference in an electric potential between the first electric potential and the second electric potential.

2. The display device according to claim 1,
wherein the internal wiring of the first drive circuit is charged depending on a drive signal of which a phase difference with the one drive signal is greater than or equal to a minimum phase difference of the M-phase drive signals and less than a period of the first electric potential or the second electric potential in the predetermined cycle.

3. The display device according to claim 2,
wherein the internal wiring of the first drive circuit is charged depending on a drive signal of which a phase is set to be later by the minimum phase difference than the one drive signal, and
when the corresponding gate line is switched to be in the unselected state, the internal wiring of the first drive circuit has an electric potential higher than or equal to the first electric potential.

4. The display device according to claim 2,
wherein the internal wiring of the first drive circuit is charged depending on a drive signal of which a phase is set to be earlier by the minimum phase difference than the one drive signal, and
when the corresponding gate line is switched to be in the selected state, the internal wiring of the first drive circuit has an electric potential higher than or equal to the first electric potential.

5. The display device according to claim 3,
wherein the output circuit unit further includes a second output switching element,
the second output switching element includes a gate electrode that is connected to the internal wiring of a second drive circuit different from the first drive circuit among the plurality of drive circuits, a drain electrode that is supplied with the one drive signal, and a source electrode that is connected to the corresponding gate line, the internal wiring of the second drive circuit is charged depending on a drive signal of which a phase is different from a drive signal supplied to the first drive circuit, and when the corresponding gate line is switched to be in the selected state, and when the corresponding gate line is switched to be in the unselected state, the internal wiring of the first drive circuit or the second drive circuit has an electric potential higher than or equal to the first electric potential.

6. The display device according to claim 1, wherein in the one drive circuit, the output circuit unit further includes a third output switching element that decreases an electric potential of the corresponding gate line to the second electric potential when the corresponding gate line is set to be in the unselected state.

7. The display device according to claim 1, wherein in the one drive circuit, the output circuit unit further includes a fourth output switching element, and the fourth output switching element includes a gate electrode that is connected to the internal wiring of the one drive circuit, a drain electrode that is supplied with the one drive signal, and a source electrode that is connected to the corresponding gate line.

8. The display device according to claim 1, wherein the drive circuits corresponding to the gate lines are individually arranged in each area at both ends of the gate lines outside a display area in the display panel.

9. The display device according to claim 1, wherein the plurality of drive circuits are distributedly arranged in a first area on one end part side of the gate lines and a second area on the other end part side outside a display area in the display panel.

10. The display device according to claim 9, wherein the drive circuits that correspond to the odd-numbered gate lines among the plurality of gate lines are arranged in the first area, and the drive circuits that correspond to the even-numbered gate lines among the plurality of gate lines are arranged in the second area.

11. The display device according to claim 5, wherein the plurality of drive circuits are distributedly arranged in a first area on one end part side of the gate lines and a second area on the other end part side outside a display area in the display panel, the internal wiring of the drive circuits corresponding to the odd-numbered gate lines among the plurality of gate lines and a part of the switching elements of the output circuit unit are arranged in the first area, and the other switching elements of the output circuit unit are arranged in the second area, and the internal wiring of the drive circuits corresponding to the even-numbered gate lines among the plurality of gate lines and a part of the switching elements of the output circuit unit are arranged in the second area, and the other switching elements of the output circuit unit are arranged in the first area.

12. The display device according to claim 1, wherein the drive unit alternately switches between a scanning period for scanning the gate lines and a non-scanning period for stopping the scanning of the gate lines in one vertical scanning period, a specific gate line that is in the selected state is present in plural number among the plurality of gate lines before the non-scanning period is started, a drive circuit that corresponds to the one specific gate line switches the one specific gate line to be in the unselected state until the non-scanning period is started, and a first drive signal that is supplied to the first drive circuit connected to the first output switching element in the drive circuit corresponding to the one specific gate line among the M-phase drive signals is continuously supplied until the one specific gate line is switched to be in the unselected state.

13. The display device according to claim 12, wherein the M-phase drive signals are individually supplied such that an electric potential of the first drive signal is set to the first electric potential when the scanning period is resumed after the non-scanning period, and the first drive circuit switches the other specific gate lines other than the one specific gate line to be in the selected state based on the first drive signal after the scanning period is resumed.

\* \* \* \* \*